United States Patent
Saitoh et al.

(10) Patent No.: US 12,484,399 B2
(45) Date of Patent: Nov. 25, 2025

(54) DISPLAY DEVICE AND METHOD FOR MANUFACTURING DISPLAY DEVICE

(71) Applicant: Sharp Kabushiki Kaisha, Sakai (JP)

(72) Inventors: Takao Saitoh, Sakai (JP); Yohsuke Kanzaki, Sakai (JP); Masaki Yamanaka, Sakai (JP); Yi Sun, Sakai (JP); Masahiko Miwa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 566 days.

(21) Appl. No.: 17/909,862

(22) PCT Filed: Apr. 21, 2020

(86) PCT No.: PCT/JP2020/017210
§ 371 (c)(1),
(2) Date: Sep. 7, 2022

(87) PCT Pub. No.: WO2021/214872
PCT Pub. Date: Oct. 28, 2021

(65) Prior Publication Data
US 2024/0206251 A1 Jun. 20, 2024

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1201* (2023.02); *H10K 59/124* (2023.02); *H10K 2102/311* (2023.02)

(58) Field of Classification Search
CPC .................. H10K 59/131; H10K 59/1201
See application file for complete search history.

(56) References Cited

U.S. PATENT DOCUMENTS

| 2017/0092708 A1* | 3/2017 | Jeon .................... H10K 59/124 |
| 2018/0138431 A1 | 5/2018 | Nishimura |

(Continued)

FOREIGN PATENT DOCUMENTS

| JP | 2018-078057 A | 5/2018 |
| JP | 2019-078847 A | 5/2019 |
| WO | 2020/044439 A1 | 3/2020 |

OTHER PUBLICATIONS

Official Communication issued in International Patent Application No. PCT/JP2020/017210, mailed on Jun. 30, 2020.

*Primary Examiner* — Douglas M Menz
(74) *Attorney, Agent, or Firm* — Keating & Bennett, LLP

(57) ABSTRACT

A display device of the present disclosure has a display region including a thin-film transistor, a terminal section, and a bending portion provided between the display region and the terminal section, and the display device includes the following: a resin layer provided above a base in the bending portion; an insulating layer provided to cover the resin layer; and a first wire provided above the insulating layer and extending in a first direction to electrically connect the thin-film transistor and the terminal section together, the first direction being a direction where the display region and the terminal section are disposed, wherein in the bending portion, the resin layer has at least one hole or dent overlapping the first wire in a plan view, and the insulating layer has at least one opening overlapping the at least one hole or dent in a plan view.

20 Claims, 26 Drawing Sheets

(51) Int. Cl.
*H10K 59/124* (2023.01)
*H10K 102/00* (2023.01)

(56) References Cited

U.S. PATENT DOCUMENTS

2020/0243782 A1 7/2020 Maruyama
2021/0313412 A1 10/2021 Okabe et al.

* cited by examiner

DISPLAY DEVICE AND METHOD FOR MANUFACTURING DISPLAY DEVICE

TECHNICAL FIELD

The present disclosure relates to a display device and a method for manufacturing the display device.

BACKGROUND ART

In the rerated art, flexible display devices have been developed using a base material with flexibility. For instance, Patent Literature 1 discloses a display device with a portion where wires are formed on a base being folded back to the backside of a display region, in a component-mounted region, where components, including a flexible printed board and a drive circuit, are mounted.

CITATION LIST

Patent Literature

Patent Literature 1: Japanese Unexamined Patent Application Publication No. 2018-78057

SUMMARY

Technical Problem

The component-mounted region has, in addition to the wires, a stack of a plurality of function layers, including a layer for adjusting wire placement height and an insulating layer. Bending a portion where the plurality of function layers are stacked elongates a function layer located on the outer periphery of the bending portion and compresses a function layer located on the inner periphery of the bending portion. Hence, the function layers can have, in some cases, a crack that is caused by a stress depending on the material of the function layers. Such a crack possibly breaks the wires.

The present disclosure has been made in view of this problem. One aspect of the present disclosure is to provide a display device and a method for manufacturing the display device that can prevent the effect of a crack that occurs when the display device is bent.

Solution to Problem

A display device of the present disclosure has a display region including a thin-film transistor, a terminal section, and a bending portion provided between the display region and the terminal section, and the display device includes the following: a resin layer provided above a base in the bending portion: an insulating layer provided to cover the resin layer; and a first wire provided above the insulating layer and extending in a first direction to electrically connect the thin-film transistor and the terminal section together, the first direction being a direction where the display region and the terminal section are disposed, wherein in the bending portion, the resin layer has at least one hole or dent overlapping the first wire in a plan view, and the insulating layer has at least one opening overlapping the at least one hole or dent in a plan view.

A method for manufacturing a display device of the disclosure is a method for manufacturing a display device having a display region including a thin-film transistor, a terminal section, and a bending portion provided between the display region and the terminal section, and the method includes the following steps: providing a resin layer above a base in the bending portion: providing at least one hole or dent in the resin layer; providing an insulating layer that covers the resin layer: providing at least one opening in the insulating layer; providing, above the insulating layer, a first wire that extends in a first direction to electrically connect the thin-film transistor and the terminal section together, the first direction being a direction where the display region and the terminal section are disposed: bringing the first wire and the at least one hole or dent of the resin layer into overlap in a plan view: and bringing the at least one opening of the insulating layer and the at least one hole or dent of the resin layer into overlap in a plan view.

One aspect of the present disclosure is to provide a display device and a method for manufacturing the display device that can prevent the effect of a crack that occurs when the display device is bent.

DESCRIPTION OF EMBODIMENTS

The embodiments of the present disclosure will be described with reference to the drawings. Identical or equivalent components will be denoted by the same signs throughout the drawings. The description of identical or equivalent components in the individual embodiments will not be repeated.

First Embodiment

Figure 1:
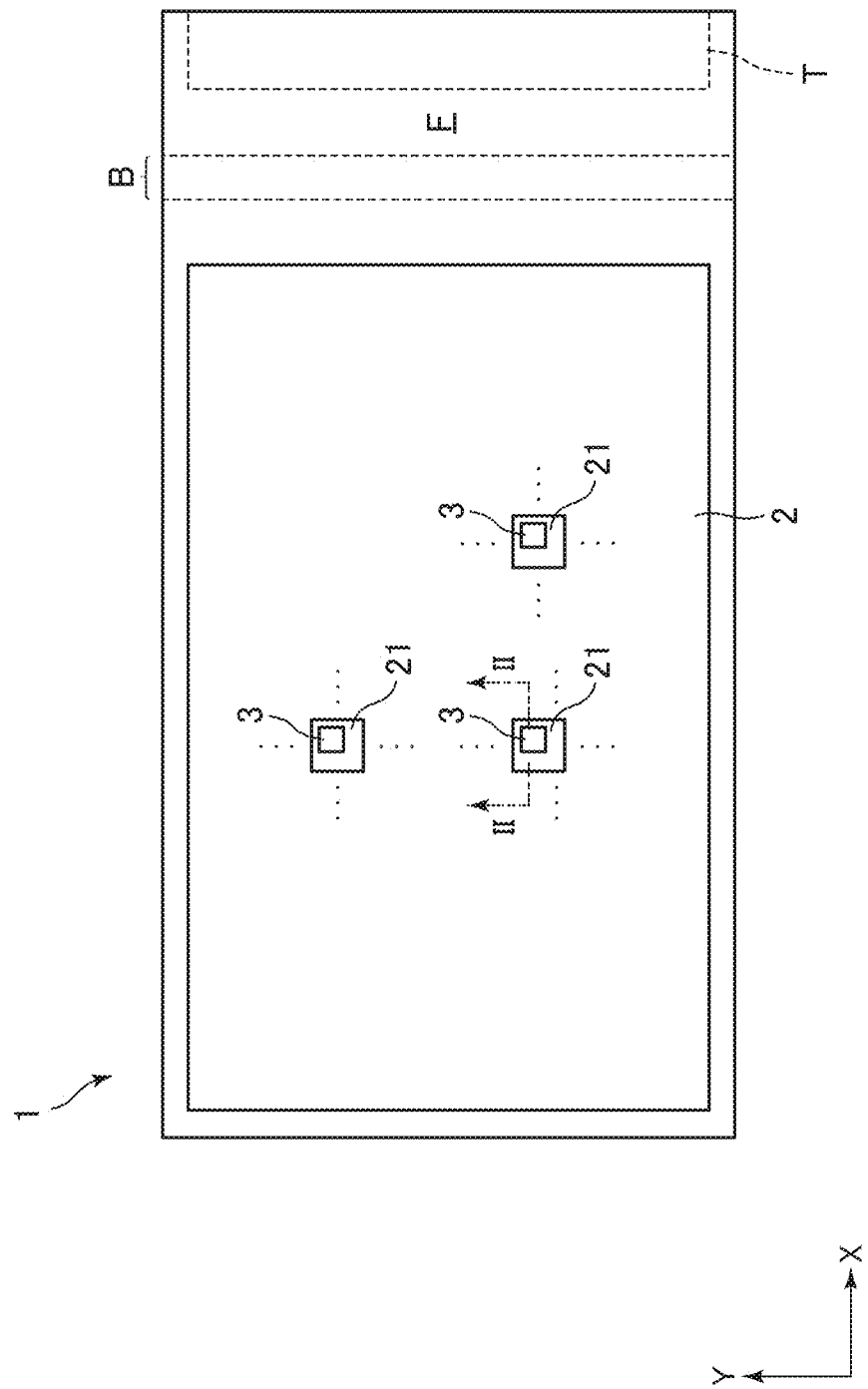
FIG. 1 is a plan view of a display device according to a first embodiment.

FIG. 1 is a schematic plan view of a display device 1 according to a first embodiment. The display device 1 has a display region 2 and a frame region F surrounding the display region 2. The frame region F includes a bending portion B and a terminal section T. The bending portion B is provided between the display region 2 and the terminal section T in the frame region F.

As illustrated in FIG. 1, the display region 2 has a plurality of pixels 21 arranged in, for instance, matrix. Each of the plurality of pixels 21 includes, but not limited to, a thin-film transistor (TFT) 3 for controlling components, including liquid crystals and electro-luminescence (EL) components. Although not shown, the terminal section T is provided with a plurality of terminals, and the plurality of terminals are electrically connected to an electric circuit and a control circuit both placed in the terminal section T. The X-direction in FIG. 1 is a first direction, and a Y-direction intersecting with the first direction is a second direction. The X-direction and the Y-direction are orthogonal to each other in a plan. The X-direction and the Y-direction correspond to the lateral direction and longitudinal direction of the display device 1, which has a rectangular outline. The display region 2, the bending portion B, and the terminal section T are arranged in the first direction.

The first direction is not limited to the X-direction: the first direction may be any direction from the display region 2 to the terminal section T.

In FIG. 1, the terminal section T is folded back to the backside of the display region 2 by bending the bending portion B along an imaginary line in the Y-direction, which is a bending line. Accordingly, the back side surface of the terminal section T and the back side surface of the display region 2 are disposed to face each other. That is, at least part of the frame region F overlaps the display region 2 in a plan view. This can reduce the occupied area of the frame region F, thus achieving the display device 1 with a narrow frame.

Figure 2:
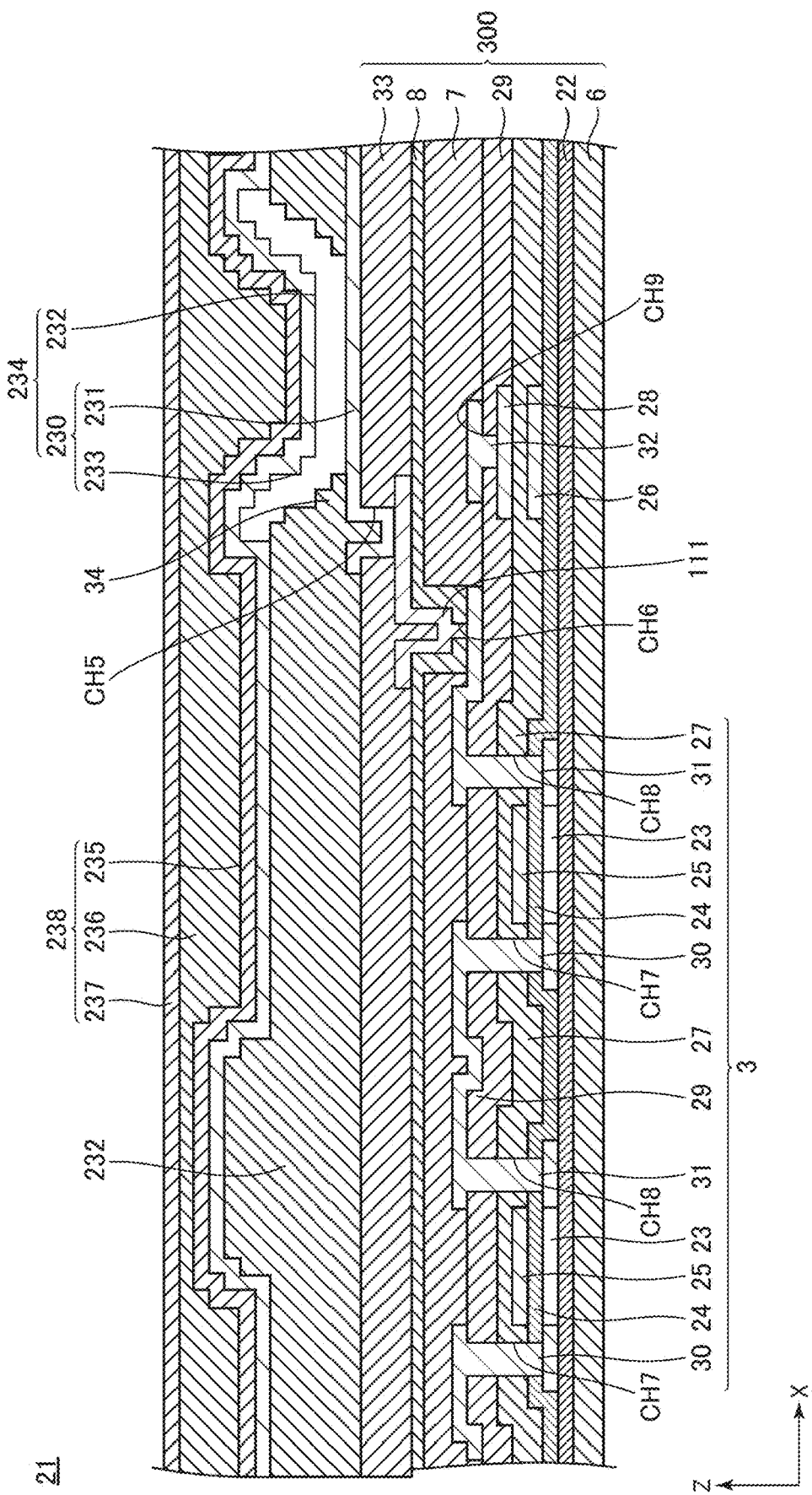
FIG. 2 is a sectional view taken along line II-II in FIG. 1.
Figure 3:
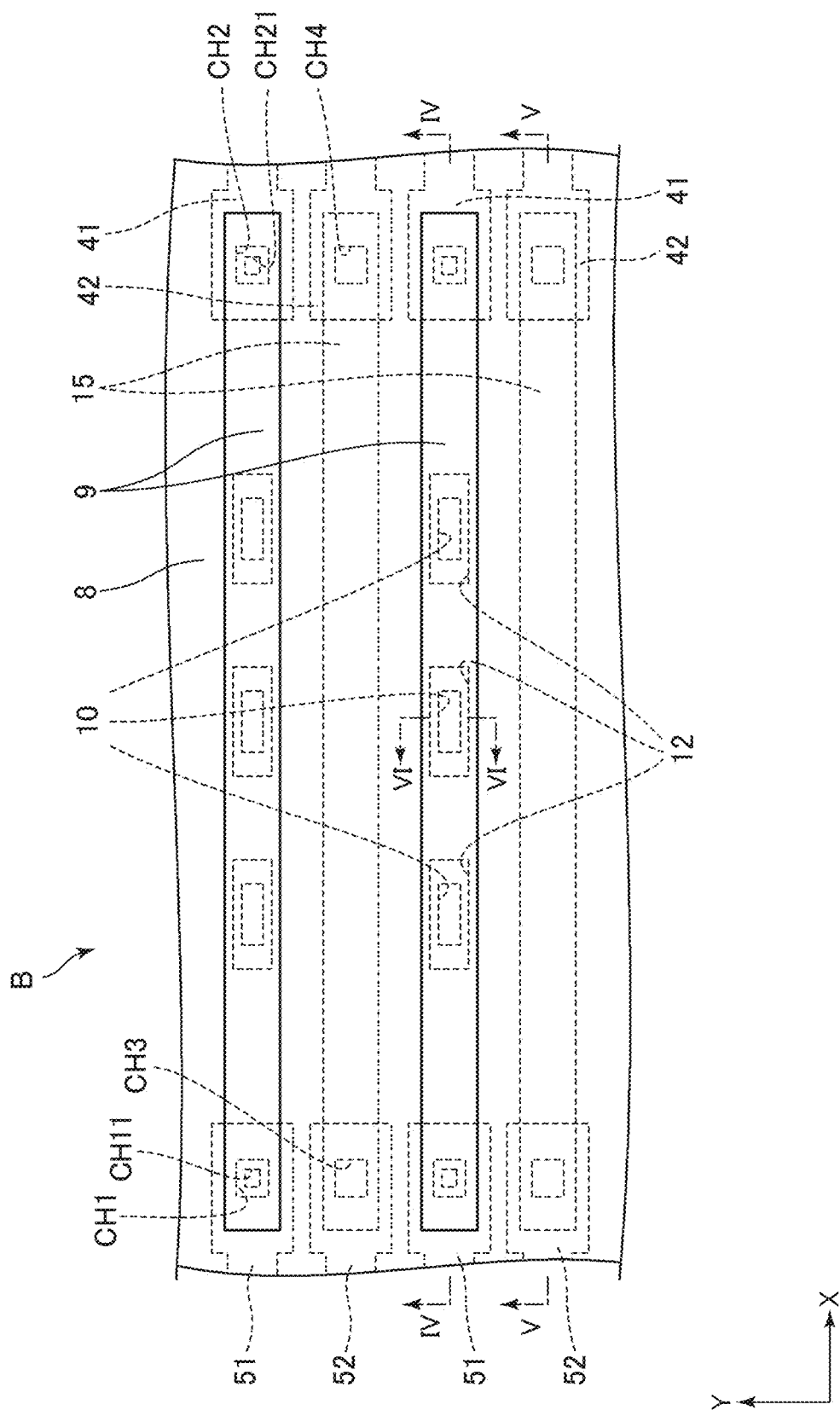
FIG. 3 is a plan view of the vicinity of a bending portion according to the first embodiment.
Figure 4:
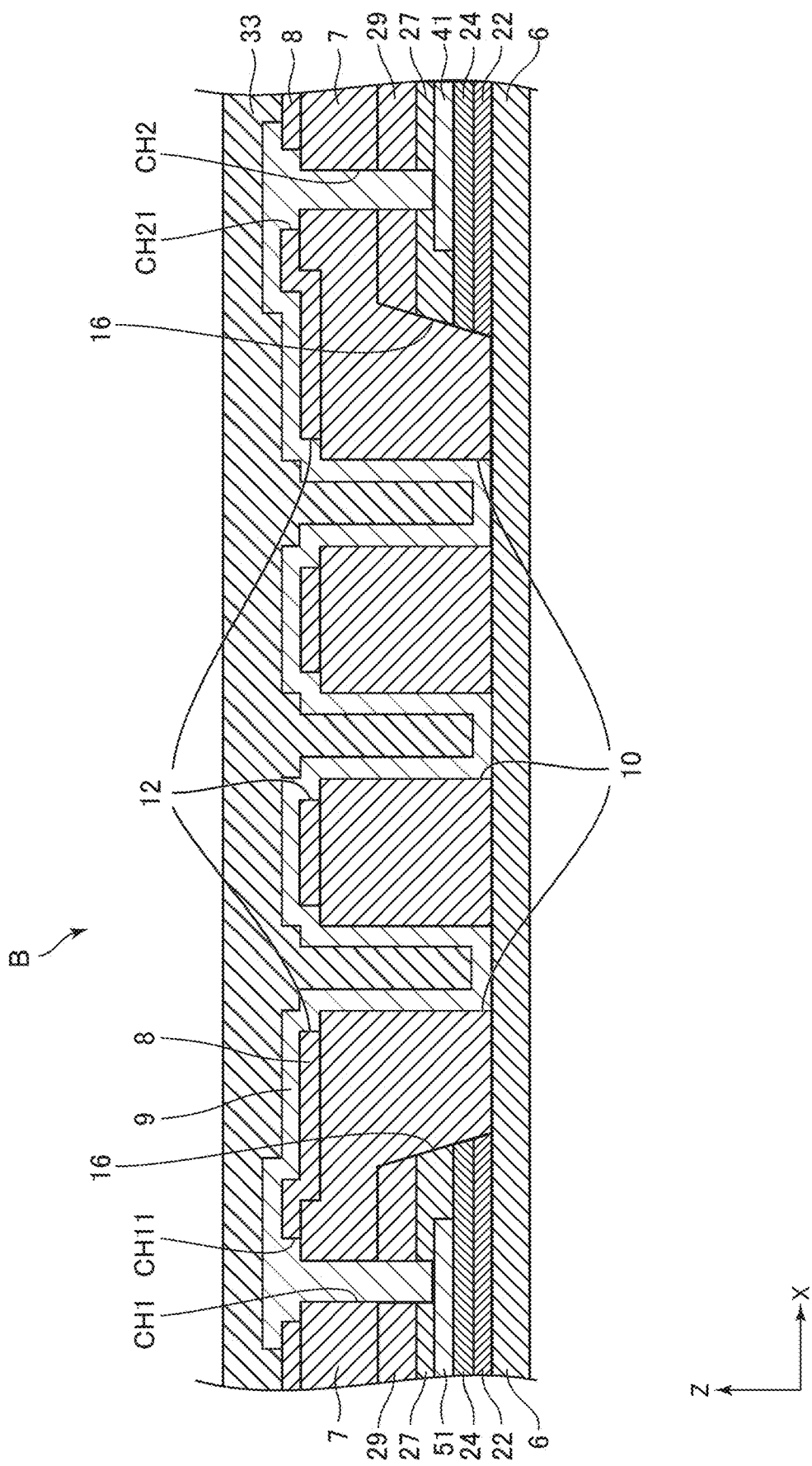
FIG. 4 is a sectional view taken along line IV-IV in FIG. 3.
Figure 5:
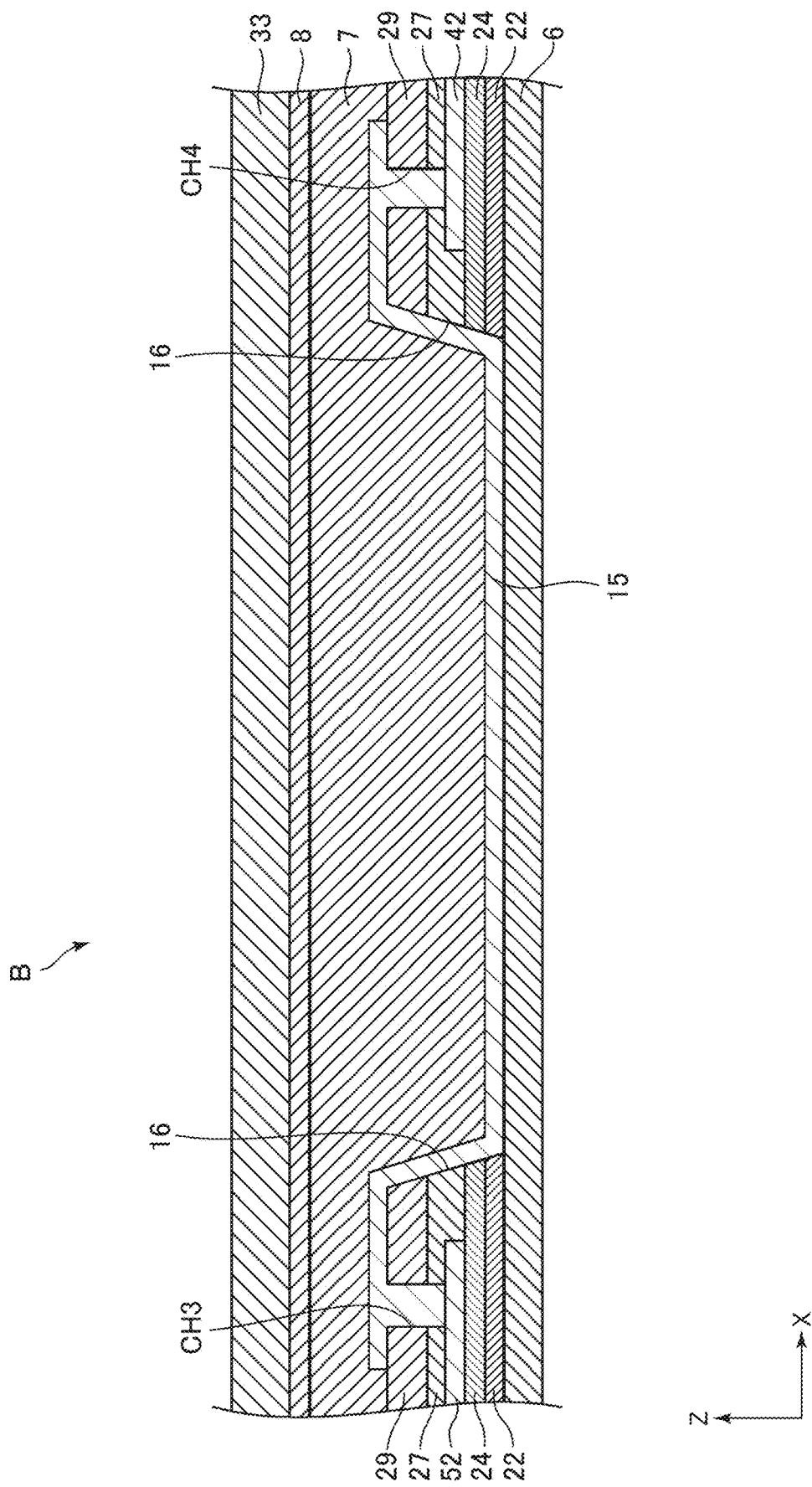
FIG. 5 is a sectional view taken along line V-V in FIG. 3.

FIG. 2 is a sectional view taken along line II-II in FIG. 1. That is, FIG. 2 illustrates the partial sectional structure of a pixel 21 within the display region 2 taken mainly in the X-direction near the TFT 3. In FIG. 2, the up-and-down direction of the display device 1 orthogonal to the X-direction is defined as a Z-direction. In the Description, the foregoing X-direction, Y-direction and Z-direction are each directions along the three axes of a rectangular coordinate system. FIG. 3 is a plan view of the vicinity of the end of the display region 2 and of the frame region F in the display device 1 according to the first embodiment. FIG. 4 is a sectional view taken along line IV-IV in FIG. 3. FIG. 5 is a sectional view taken along line V-V in FIG. 3. The illustration of a protective layer 33, illustrated in FIG. 4 and FIG. 5, is omitted in FIG. 3 for simplification: FIG. 3 is a plan view of a portion under a first wire 9. As seen from FIG. 3, the bending portion B includes a plurality of first wires 9 and a plurality of second wires 15 all extending in the X-direction.

A base 6 is a component that is a basis for each component according to the first embodiment, as seen from FIG. 2 and FIG. 3. The base 6 is a bendable member in the form of a plate and is formed of, for instance, a resin material having flexibility, such as polyimide. It is noted that the components of the display region 2 illustrated in FIG. 2 and the components of the frame region F illustrated in FIGS. 3 to 5 are formed together on the base 6 through process steps some of which are common.

A base coat film 22 is provided on the base 6, as seen from FIG. 2, FIG. 4 and FIG. 5. The base coat film 22 is a barrier layer for avoiding moisture from intruding through the base 6 into the display device 1 and is composed of, for instance, an inorganic insulating monolayer or laminated film of silicon nitride, silicon oxide, silicon oxide nitride or other materials.

As seen from FIG. 2, a pixel 21 includes a semiconductor layer 23 provided on the base coat film 22. The semiconductor layer 23 is a layer that constitutes the channel of the TFT 3 and is made of a material, such as amorphous silicon, low-temperature polysilicon or an oxide semiconductor.

As seen from FIG. 2, the pixel 21 includes a gate insulating film 24 provided on the base coat film 22 and semiconductor layer 23. The gate insulating film 24 is provided on the base coat film 22 in the frame region F, as seen from FIG. 4 and FIG. 5. The gate insulating film 24 is made of a material, such as a silicon oxide film or a silicon nitride film.

The pixel 21 includes a gate electrode 25 and a gate wire 26 both provided on the gate insulating film 24, as seen from FIG. 2. As seen from FIG. 4 and FIG. 5, the frame region F includes a first routed wire 51, a first frame wire 41, a second routed wire 52, and a second frame wire 42 all provided on the gate insulating film 24. The gate electrode 25, the gate wire 26, the first routed wire 51, the first frame wire 41, the second routed wire 52, and the second frame wire 42 are formed in the same process step. Thus, the same conductive material can be used for the gate electrode 25, the gate wire 26, the first routed wire 51, the first frame wire 41, the second routed wire 52 and the second frame wire 42. Further, although not shown, scan signal lines and light-emission control lines are formed in the display region 2 in the same process step as the process step of forming the gate electrode 25 and gate wire 26 and are provided on the gate insulating film 24.

The gate electrode 25, the gate wire 26, the scan signal lines, the light-emission control lines, the first routed wire 51, the first frame wire 41, the second routed wire 52, and the second frame wire 42 are composed of a metal monolayer or laminated film containing at least one of aluminum (Al), tungsten (W), molybdenum (Mo), tantalum (Ta), chromium (Cr), titanium (Ti) and copper (Cu).

The pixel 21 includes a first interlayer insulating film 27 provided on the gate insulating film 24, gate electrode 25 and gate wire 26, as seen from FIG. 2. Further, the first interlayer insulating film 27 is provided on the first routed wire 51, first frame wire 41, second routed wire 52 and second frame wire 42 in the frame region F, as seen from FIG. 4 and FIG. 5. The first interlayer insulating film 27 can be formed using a film, including a silicon oxide film and a silicon nitride film.

The pixel 21 includes a capacitive wire 28 and an initialization signal line (not shown) both provided on the first interlayer insulating film 27, as seen from FIG. 2. Further, although not shown, initialization signal lines as well as capacitive wires 28 are formed in the display region 2. Thus, the same conductive material can be used for the capacitive wires 28 and the initialization signal lines.

The capacitive wire 28 and the initialization signal line are composed of a monolayer or laminated film of metal containing at least one of aluminum (Al), tungsten (W), molybdenum (Mo), tantalum (Ta), chromium (Cr), titanium (Ti) and copper (Cu)

The pixel 21 includes a second interlayer insulating film 29 provided on the first interlayer insulating film 27 and capacitive wire 28, as seen from FIG. 2. Further, the second interlayer insulating film 29 is provided on the first interlayer insulating film 27 in the frame region F, as seen from FIG. 4 and FIG. 5. The second interlayer insulating film 29 can be formed of, for instance, a silicon oxide film or a silicon nitride film or can be formed of a stack of these films.

The pixel 21 includes a source electrode 30, a drain electrode 31, and a high-voltage power-source line 32 all provided on the second interlayer insulating film 29, as seen from FIG. 2. Further, although not shown, a source wire is provided on the second interlayer insulating film 29. The source electrode 30 is connected to a source region of the semiconductor layer 23 via a contact hole CH7. Further, the drain electrode 31 is connected to a drain region of the semiconductor layer 23 via a contact hole CH8. The foregoing components form the TFT 3 in the pixel 21.

As seen from FIG. 4 and FIG. 5, a stack of the base coat film 22 through the second interlayer insulating film 29 is removed in the bending portion B in the frame region F, thus facilitating the bending of the bending portion B. Moreover, as seen from FIG. 5, the second wire 15 is provided on the base 6 in the bending portion B and is provided on the second interlayer insulating film 29 in the frame region F excluding the bending portion B. The source electrode 30, drain electrode 31, high-voltage power-source line 32, source wire, and second wire 15 illustrated in FIG. 2 are formed in the same process step. Thus, the same conductive material can be used for the source electrode 30, the drain electrode 31, the high-voltage power-source line 32, the source wire and the second wire 15.

As seen from FIG. 5, the first interlayer insulating film 27 and second interlayer insulating film 29 on the end of the second routed wire 52 are provided with a contact hole CH3, and the first interlayer insulating film 27 and second interlayer insulating film 29 on the second frame wire 42 are provided with a contact hole CH4. As seen from FIG. 3 and FIG. 5, the second wire 15 extends in the X-direction, and the second wire 15 has one end electrically connected to the second routed wire 52 via the contact hole CH3, and the other end electrically connected to the second frame wire 42 via the contact hole CH4.

The pixel 21 includes a resin layer 7 provided on the source electrode 30, source wire (not shown), drain electrode 31 and high-voltage power-source line 32, as illustrated in FIG. 2. Further, the resin layer 7 is provided on the base 6, second interlayer insulating film 29 and second wire 15 in the frame region F, as seen from FIG. 4 and FIG. 5. The resin layer 7 is a layer that flattens a surface by smoothing asperities generated by layers formed in the anterior process steps. The resin layer 7 is an organic resin layer and has flexibility. The resin layer 7 can be composed of a photosensitive organic material that can be applied, including polyimide and acrylic.

The pixel 21 includes a first hole formed in the resin layer 7, as illustrated in FIG. 2. The first hole has a bottom from which the upper surface of the drain electrode 31 is exposed. Further, the bending portion B includes a plurality of holes 10 formed in the resin layer 7, as seen from FIG. 3 and FIG. 4. The plurality of holes 10 are disposed in a location overlapping the first wires 9 in a plan view, which will be described later on, and are arranged in the X-direction.

As seen from FIG. 2, FIG. 4 and FIG. 5, an insulating layer 8 is provided on the resin layer 7. The insulating layer 8 is a layer for preventing particles resulting from surface damage to the resin layer 7 in a process step of forming the first wires 9 and relay electrodes 111, which will be described later on. That is, the insulating layer 8 is a layer for covering the resin layer 7 for protection. The insulating layer 8 is composed of an inorganic insulating film for instance. The insulating layer 8 can be composed of, for instance, a silicon oxide (SiOx) film or a silicon nitride (SiNx) film or can be composed of, for instance, a stack of these films. The insulating layer 8 is preferably thin as much as possible so that the bending portion B is not difficult to bend; for instance, the insulating layer 8 is 50 to 500 nm thick.

The pixel 21 includes a contact hole CH6 provided in the insulating layer 8, as seen from FIG. 2. The contact hole CH6 has a bottom from which the upper surface of the drain electrode 31 is exposed. Further, the bending portion B includes a plurality of openings 12 formed in the resin layer 8, as seen from FIG. 3 and FIG. 4. The plurality of respective openings 12 are disposed in a location overlapping the plurality of holes 10 in a plan view.

The pixel 21 includes a relay electrode 111 provided on the insulating layer 8, as seen from FIG. 2. The relay electrode 111 is electrically connected to the drain electrode 31 via the contact hole CH6.

The first wire 9 is provided on the insulating layer 8 in the frame region F, as seen from FIG. 4. Further, as seen from FIG. 3 and FIG. 4, the first wire 9 extends in the X-direction while passing through the plurality of openings 12 and the plurality of holes 10 and is in contact with the base 6 at the bottoms of the holes 10. The first wire 9 can be formed in the same process step, in the same layer and of the same material (fourth conductive film) as the relay electrode 111. The first wire 9 and the relay electrode 111 are composed of, for instance, a metal monolayer or laminated film containing at least one of aluminum (Al), tungsten (W), molybdenum (Mo), tantalum (Ta), chromium (Cr), titanium (Ti) and copper (Cu).

As seen from FIG. 4, the first interlayer insulating film 27, second interlayer insulating film 29 and resin layer 7 on the end of the first routed wire 51 are provided with a contact hole CH1, and the insulating layer 8 is provided with a contact hole CH11. Further, the first interlayer insulating film 27, second interlayer insulating film 29 and resin layer 7 on the first frame wire 41 are provided with a contact hole CH2, and the insulating layer 8 is provided with a contact hole CH21. As seen from FIG. 3 and FIG. 4, the first wire 9 extends in the X-direction, and the first wire 9 has one end electrically connected to the first routed wire 51 via the contact hole CH1 and the contact hole CH11, and the other end electrically connected to the first frame wire 41 via the contact hole CH2 and the contact hole CH21.

The protective layer 33 is provided on the insulating layer 8, as seen from FIG. 2, FIG. 4 and FIG. 5. The protective layer 33 is also provided on the first wire 9, as seen from FIG. 4. The protective layer 33 can be composed of a photosensitive organic material that can be applied, including polyimide and acrylic. Above the protective layer 33, a light-emitting element 230 including quantum dots, organic EL elements or other things are provided. The base 6 through the protective layer 33 are referred to as a TFT layer 300, as illustrated in FIG. 2.

As seen from FIG. 2, the display region 2 includes a light-emitting element layer 234 formed on the protective layer 33, and a sealing layer 238 formed on the light-emitting element layer 234. The light-emitting element layer 234 includes the following: the light-emitting element 230 on which a first electrode (anode) 231, a light emitter portion 34, and a second electrode (cathode) 233 are stacked in this order: and an edge cover 232 covering the side surface of the light-emitting element 230.

The first electrode 231 is composed of, for instance, a stack of an indium tin oxide (ITO) and an Ag-containing alloy and has reflectivity of light.

Although not shown, the light emitter portion 34 is composed of, for instance, a stack of, in sequence from the bottom, a hole injection layer, a hole transport layer, a light-emitter portion layer, an electron transport layer and an electron injection layer.

The second electrode 233 can be composed of, for instance, a light-transparency conductive material, including an indium tin oxide (ITO) and an indium zinc oxide (IZO).

Further, the sealing layer 238 includes a first inorganic insulating film 235, an organic film 236, and a second inorganic insulating film 237 stacked in this order.

The first inorganic insulating film 235 and the second inorganic insulating film 237 can be composed of, for instance, a silicon oxide film, a silicon nitride film and a silicon oxide nitride film, which are formed through plasma CVD, or can be composed of, for instance, a stack of these films.

The organic film 236 can be composed of a photosensitive organic material that can be applied, including polyimide and acrylic.

The following details the configuration of the frame region F on the basis of FIG. 3 through FIG. 5. As seen from FIG. 3, the plurality of first wires 9 and the plurality of second wires 15 are arranged alternately in the Y-direction in a plan view.

As seen from FIG. 3 and FIG. 4, one of the ends of each first wire 9 is electrically connected to one of the ends of the first routed wire 51, the other end of the first routed wire 51 is electrically connected to one of the ends of the source wire (not shown) of the pixel 21, and the other end of the source wire (not shown) is electrically connected to the source electrode 30 of the TFT 3. The other end of the first wire 9 is electrically connected to one of the ends of the first frame wire 41, and the other end of the first frame wire 41 is electrically connected to the terminals (not shown) in the terminal section T.

One of the ends of each second wire 15 is electrically connected to one of the ends of the second routed wire 52, as seen from FIG. 3 and FIG. 5. Although not shown, the other end of the second routed wire 52 is electrically connected to one of the ends of the source wire (not shown) of the pixel 21. Although not shown, the other end of the source wire (not shown) is electrically connected to the source electrode 30 of the TFT 3. The other end of the second wire 15 is electrically connected to one of the ends of the second frame wire 42, and the other end of the second frame wire 42 is electrically connected to the terminals (not shown) within the terminal section T.

The control circuit (not shown) electrically connected to the terminals within the terminal section T controls the TFTs 3 in the pixels 21, thus enabling the display device 1 to operate.

The first wire 9 is formed to extend along the inner surfaces of the openings 12 and holes 10, as seen from FIG. 4. The first wire 9 is thus formed to snake in the Z-direction. The first wire 9, which snakes, reduces a tensile stress that occurs in the first wire 9 in the direction where the first wire 9 extends when the bending portion B is bent. This can prevent a break in the first wire 9.

A crack that occurs in the insulating layer 8 when the bending portion B is bent can be blocked in the opening 12 when spreading in the Y-direction, as seen from FIG. 3 and FIG. 4. Thus, crack spreading that occurs in the insulating layer 8 can be prevented. Additionally, providing the holes 10 in the resin layer 7 can mitigate elongation of the upper surface of the resin layer 7 at the time of bending, thus preventing the resin layer 7 from a crack that extends in the Y-direction. The foregoing configuration can prevent a crack that occurs in the insulating layer 8 and resin layer 7 when the bending portion B is bent and can prevent the first wire 9 from a break resulting from such cracks.

FIG. 5 is a sectional view taken along line V-V in FIG. 3. The second wire 15 is provided under the resin layer 7 between the base 6 and the resin layer 7. As seen from FIG. 5, the bending portion B has a bending opening 16 formed with the base coat film 22, gate insulating film 24, first interlayer insulating film 27 and second interlayer insulating film 29 removed therefrom. The bending opening 16 has a bottom from which the upper surface of the base 6 is exposed. As seen from FIG. 5, the second wire 15 is formed along the side-wall surface of the bending opening 16 and along the upper surface of the base 6. As seen from a comparison between FIG. 4 and FIG. 5, the first wire 9 is formed over the resin layer 7, and the second wire 15 is formed under the resin layer 7. That is, the first wire 9 and the second wire 15 are formed in different layers with the resin layer 7 interposed therebetween. This can avoid leakage between the first wire 9 and the second wire 15 even when the pitch between the first wire 9 and the second wire 15 is rendered narrow.

Figure 6:
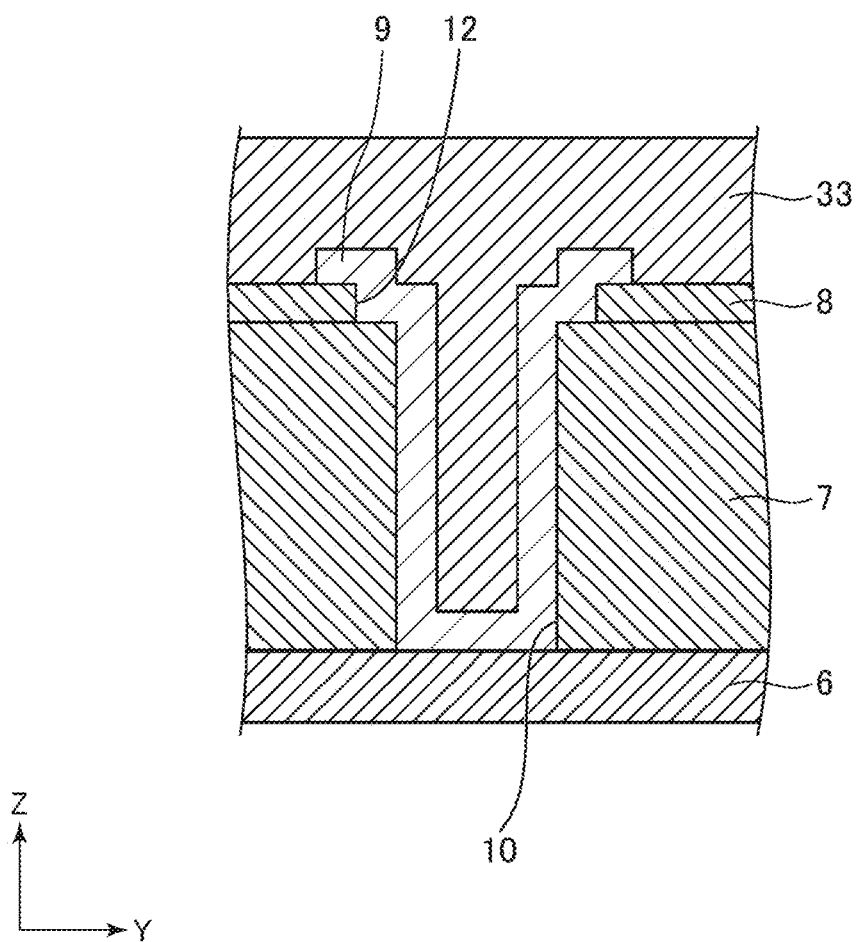
FIG. 6 is a sectional view taken along line VI-VI in FIG. 3.

FIG. 6 is a sectional view taken along line VI-VI in FIG. 3. As seen from FIG. 3 and FIG. 6, the width of the opening 12 is smaller in the Y-direction than the width of a portion of the first wire 9 overlapping the opening 12 in a plan view. It is noted that the respective widths of the openings 12, holes 10 and first wires 9 in the present disclosure are widths at their lowest portions in the Z-direction. In the foregoing configuration, the whole openings 12 are covered with the first wire 9 during etching in a patterning step for forming the first wire 9, and the resin layer 7 is thus not exposed. This can prevent particle adhesion to other portions that is caused by the removal and scattering of the resin layer 7 during etching, thereby preventing contamination resulting from the scattering of the resin layer 7.

In the first embodiment, a single first wire 9 has three holes 10 spaced from each other in the X-direction, and three openings 12 spaced from each other in the X-direction, as seen from FIG. 3 and FIG. 4. However, any number of holes 10 and any number of openings 12 may be provided. For instance, a single first wire 9 needs to be provided with at least one hole 10 and at least one opening 12. The plurality of holes 10 and the plurality of openings 12 may be provided in any location. Furthermore, each hole 10 and each opening 12 may have any size and any shape. In addition, the shapes of the outlines of each hole 10 and each opening 12 in a plan view is not limited to such a rectangular shape as illustrated in FIG. 3; the outlines of the hole 10 and opening 12 may have any shape in a plan view, including a circular shape, an elliptic shape, and a square shape.

Figure 7:
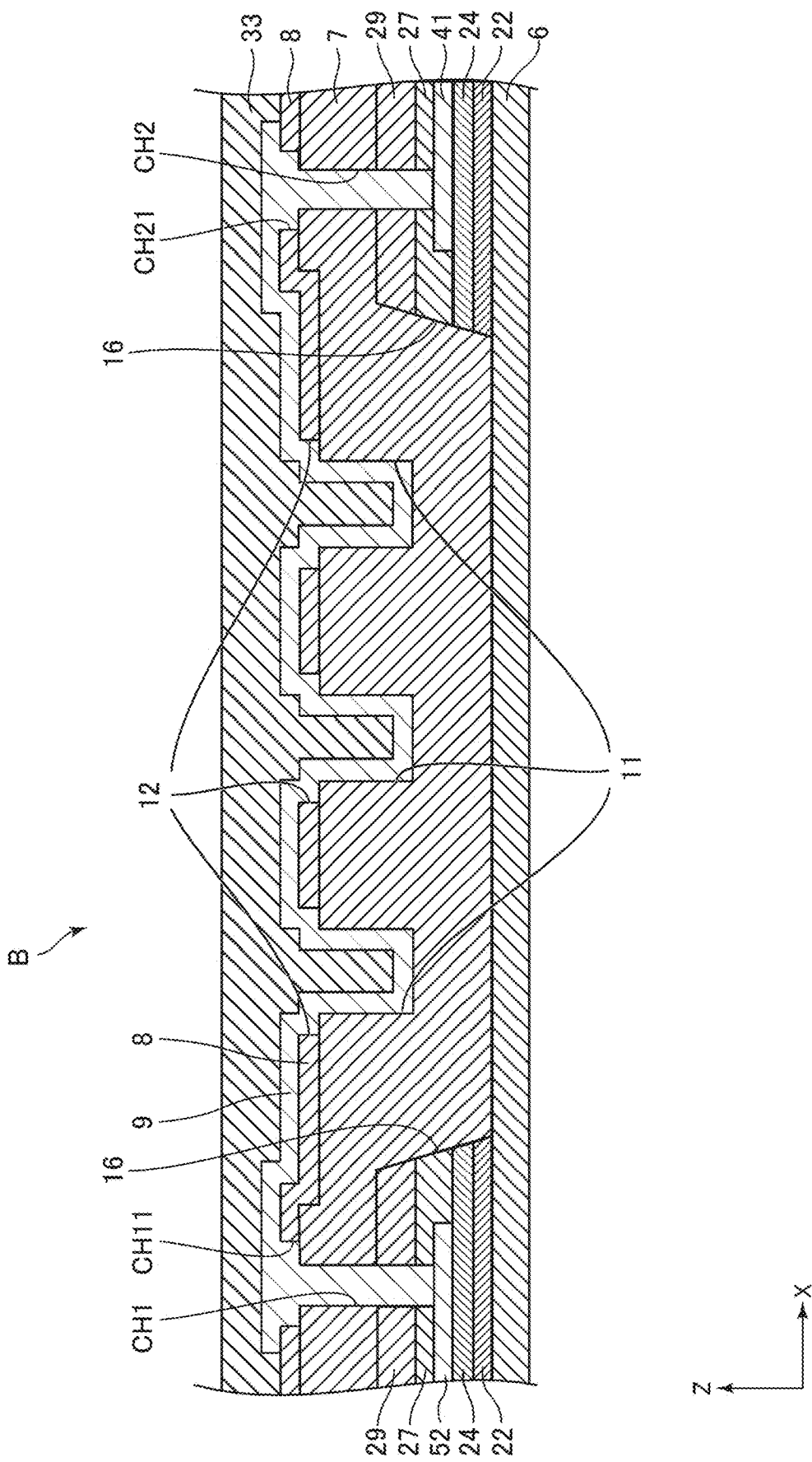
FIG. 7 is a sectional view of another example of FIG. 4.

In the present disclosure, the resin layer 7 may be provided with dents 11 instead of the holes 10. For instance, FIG. 7 illustrates another example of FIG. 4 and is a sectional view taken along line IV-IV in FIG. 3 with the dents 11 instead of the holes 10. The resin layer 7 is partly thin in portions where the dents 11 are located. This facilitates bending of the bending portion B and reduces elongation of the upper surface of the resin layer 7, thus preventing a crack in the resin layer 7. Hereinafter, unless otherwise specified, which of the hole 10 or dent 11 is to be used can be selected freely in each embodiment of the present disclosure.

Manufacturing Method According to First Embodiment

Figure 8:
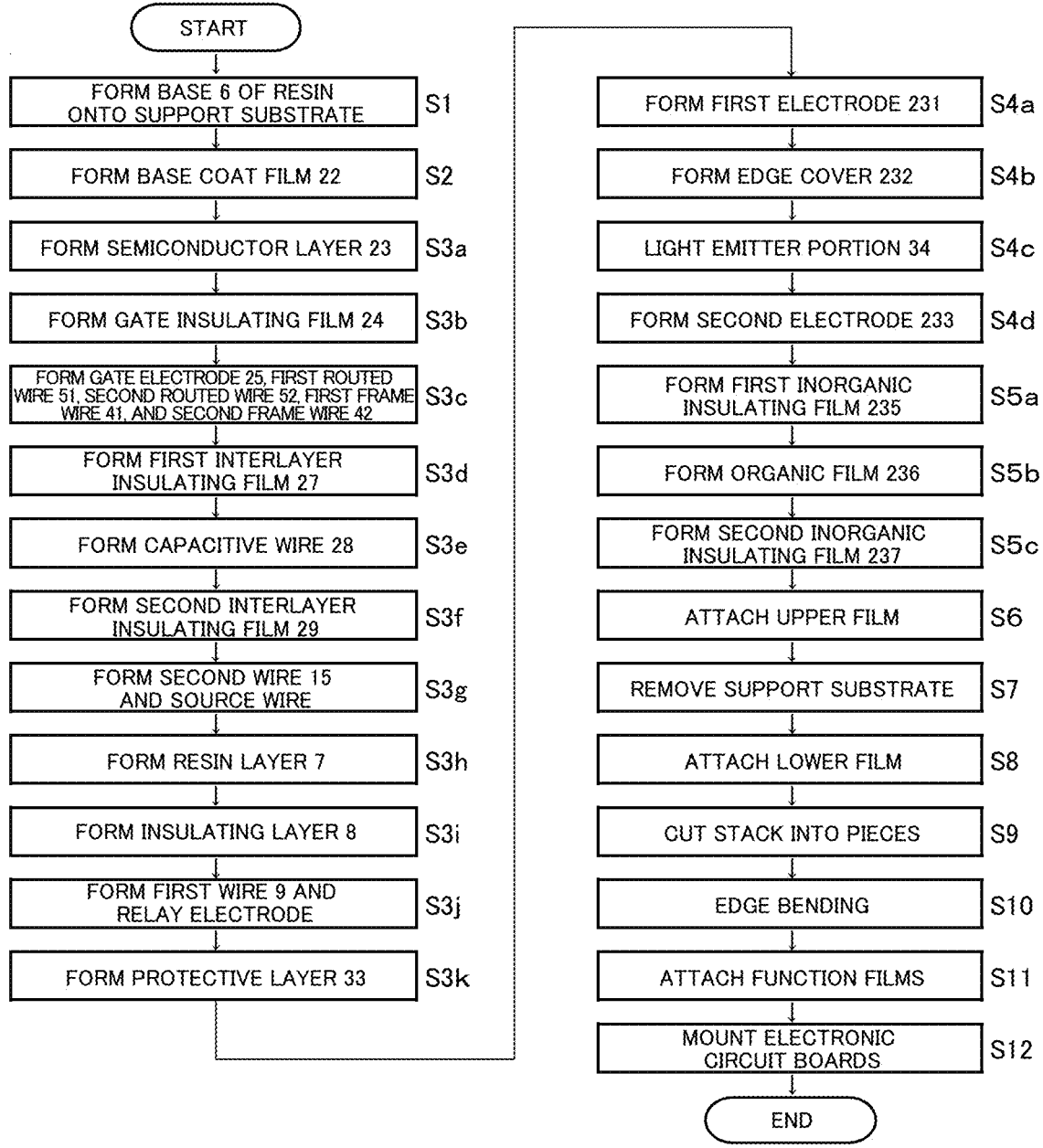
FIG. 8 is a flowchart showing a method for manufacturing the display device of the present disclosure.

A manufacturing method according to the first embodiment will be described. FIG. 8 is a flowchart showing an example method for manufacturing the display device 1 of the present disclosure. Hereinafter, "in the same layer" refers to that one layer is formed in the same process step as another layer, "under" refers to that one layer is formed in a process step anterior to a process step of forming a comparative layer, and "over" refers to that one layer is formed in a process step posterior to a process step of forming a comparative layer.

For forming a display device, the first process step (Step S1) is forming the base 6 made of resin onto a light-transparency support substrate (e.g., a mother glass substrate) not shown, as illustrated in FIG. 2, FIG. 4, FIG. 5 and FIG. 8.

The next (Step S2) is forming the base coat film 22 through chemical vapor deposition (CVD).

The next (Step S3a) is forming a semiconductor film (not shown) through CVD, followed by patterning through photolithography to form the semiconductor layer 23 (see FIG. 2).

The next (Step S3b) is forming the gate insulating film 24 through CVD (see FIG. 2).

The next is forming a first metal layer (not shown) through sputtering, followed by patterning the first metal layer (not shown) through photolithography. This forms (Step S3c) the gate electrode 25, the gate wire 26, and the light-emission control line (not shown) in the display region 2 (see FIG. 2) and forms the first routed wire 51, the second routed wire 52, the second frame wire 42, and the first frame wire 41 in the frame region F (see FIG. 4).

The next (Step S3d) is forming the first interlayer insulating film 27 composed of an inorganic insulating film through CVD.

The next is forming a second metal layer (not shown) through sputtering, followed by patterning the second metal layer (not shown) through photolithography. This forms (Step S3e) the capacitive wire 28 and the initialization signal line (not shown) in the display region 2 (see FIG. 5).

The next is forming the second interlayer insulating film 29 through CVD. Furthermore, the second interlayer insulating film 29 undergoes patterning through photolithography. This provides (Step S3f) the contact hole CH1 and the contact hole CH2 respectively in the first interlayer insulating film 27 and the second interlayer insulating film 29 on the ends of the first routed wire 51 and first frame wire 41 in the frame region F, provides the contact hole CH3 and the contact hole CH4 (see FIG. 5) in the first interlayer insulating film 27 and the second interlayer insulating film 29 on the ends of the second routed wire 52 and second frame wire 42 and provides the bending opening 16 in the base coat film 22, gate insulating film 24, first interlayer insulating film 27 and second interlayer insulating film 29 in the bending portion B. Step S3f also includes providing the contact hole CH7 and the contact hole CH8 in the gate insulating film 24, first interlayer insulating film 27 and second interlayer insulating film 29 on the semiconductor layer 23 in the display region 2, and providing the contact hole CH9 in the interlayer insulating film 29 on the capacitive wire 28 (see FIG. 2).

Here, the bending opening 16 passes through the second interlayer insulating film 29, the first interlayer insulating film 27, the gate insulating film 24 and the base coat film 22, and the bending opening 16 has a bottom from which the base 6 is exposed.

Further, the contact hole CH3 and the contact hole CH4 pass through the second interlayer insulating film 29 and the first interlayer insulating film 27, and these holes have their bottoms from which the second routed wire 52 and the second frame wire 42 are exposed (see FIG. 5).

Furthermore, the contact hole CH7 and the contact hole CH8 pass through the second interlayer insulating film 29, the first interlayer insulating film 27 and the gate insulating film 24, and the these holes have their bottoms from which the semiconductor layer 23 is exposed (see FIG. 2).

The next is forming a third metal layer (not shown) onto the second interlayer insulating film 29 through sputtering, followed by patterning the third metal layer (not shown) through photolithography. This forms the second wires 15, the trunk line of a high-voltage power-source line (not shown), and the trunk line of a low-voltage power-source line (not shown) in the bending portion B in the frame region F (see FIG. 5). Further, Step S3g is performed, which is forming the terminals (not shown) in the terminal section T in the frame region F, and forming the source wires (not shown), the high-voltage power-source line 32, the source electrodes 30, and the drain electrodes 31 in the display region 2 (see FIG. 2).

Here, one of the ends of each second wire 15 is electrically connected to the second routed wire 52 via the contact hole CH3. Further, the other end of the second wire 15 is electrically connected to the second frame wire 42 via the contact hole CH4 (see FIG. 5).

The next is applying a first resin layer (not shown), followed by thermal curing. The next (Step S3h) is providing the contact hole CH1 and the contact hole CH2 respectively in the first resin layer (not shown) over the first routed wire 51 and the first resin layer (not shown) over the first frame wire 41, and forming, in the first resin layer (not shown) in the bending portion B, the resin layer 7 provided with the holes 10 (see FIG. 4). Step S3h also includes forming the resin layer 7 provided with the first hole, in the first resin layer (not shown) on the drain electrode 31 in the display region 2 (see FIG. 2). Here, the holes 10 pass through the first resin layer (not shown), and the base 6 is exposed at the bottoms of the holes 10. The first hole passes through the first resin layer (not shown) and has a bottom from which the drain electrode 31 is exposed.

The next (Step S3i) is forming the insulating layer 8 through CVD, and providing the contact hole CH11 and the contact hole CH21 respectively in the insulating layer 8 over the first routed wire 51 and the insulating layer 8 over the first frame wire 41 in the frame region F through photolithography (see FIG. 4). Step S3i also includes providing the openings 12 in the insulating layer 8 in the bending portion B, and providing the contact hole CH6 in the insulating layer 8 on the drain electrode 31 in the display region 2 (see FIG. 2).

Here, the contact hole CH11 and the contact hole CH21 respectively overlap the contact hole CH1 and the contact hole CH2 in a plan view. Further, the openings 12 overlap the holes 10 in a plan view. Furthermore, the contact hole CH6 overlaps the first hole in a plan view (see FIG. 3).

The next is forming a fourth metal layer (not shown) through sputtering, followed by patterning the fourth metal layer (not shown) through photolithography. This forms (Step S3j) the first wires 9 each of which overlap, in a plan view, the holes 10, the openings 12, the contact hole CH1, the contact hole CH2, the contact hole CH11 and the contact hole CH21 (see FIG. 4). Further, the relay electrodes 111 each of which overlaps the first hole and the contact hole CH6 are formed in the same step (see FIG. 2). Here, one of the ends of each first wire 9 is electrically connected to the first routed wire 51 via the contact hole CH1 and the contact hole CH11. The other end of the first wire 9 is electrically connected to the first frame wire 41 via the contact hole CH2 and the contact hole CH21 (see FIG. 4). Further, each relay electrode 111 is electrically connected to the drain electrode 31 via the contact hole CH6 (see FIG. 2).

The next is applying the protective layer 33, followed by thermal curing. Furthermore, Step S3k is performed, which is providing a contact hole CH5 in the protective layer 33 on the relay electrode 111 through photolithography (see FIG. 2). The TFT layer 300 is formed through the foregoing process steps.

The next is forming a fifth metal layer (not shown) onto the protective layer 33 of the TFT layer 300 through sputtering, followed by patterning through photolithography. This forms (Step S4a) the first electrode (anode) 231 (see FIG. 2). The first electrode 231 is electrically connected to the relay electrode 111 via the contact hole CH5.

The next (Step S4b) is applying the edge cover 232 to form the edge cover 232 provided with a second hole 345 through photolithography (see FIG. 2).

The next (Step S4c) is forming the light emitter portion 34, which is not shown, in a location overlapping the second hole 345 in a plan view through evaporation using a metal mask (not shown). Although not shown, the light emitter portion 34 is composed of, for instance, a stack of, in sequence from the bottom, a hole injection layer, a hole transport layer, a light-emitting layer, an electron transport layer and an electron injection layer.

The next (Step S4d) is forming a sixth metal layer (not shown) through sputtering, followed by patterning the sixth metal layer (not shown) through photolithography to form the second electrode (cathode) 233 in the display region 2 (see FIG. 2). The light-emitting element layer 234 is formed through the foregoing process steps.

The next (Step S5a) is forming the first inorganic insulating film 235 onto the light-emitting element layer 234 through plasma CVD (see FIG. 2).

The next (Step S5b) is applying the organic film 236 (see FIG. 2).

The next (Step S5c) is forming the second inorganic insulating film 237 through plasma CVD (see FIG. 2). The sealing layer 238 is formed onto the light-emitting element layer 234 through the foregoing process steps.

The next (Step S6) is attaching an upper film (not shown) onto the sealing layer 238.

The next (Step S7) is subjecting the surface of the support substrate (not shown) where the TFT layer 300 is formed, to laser irradiation to remove the support substrate (not shown) from the TFT layer 300.

The next (Step S8) is attaching a lower film (not shown).

The next (Step S9) is cutting a stack (not shown) including the lower film (not shown), the base 6, the TFT layer 300, the light-emitting element layer 234 and the sealing layer 238 into a plurality of pieces (not shown).

The next (Step S10) is subjecting the obtained pieces (not shown) to edge bending (processing where the bending portion B is bent 180 degrees), and placing terminals (not shown) onto the non-formed surface of the light-emitting element layer 234.

The next (Step S11) is attaching function films (not shown), such as a circular polarizer plate.

The next (Step S12) is mounting electronic circuit boards (not shown), such as an IC chip, onto terminals (not shown) on the lower surface to complete the display device 1.

Modification of First Embodiment

Modifications 1-1 to 1-6 of the display device 1 according to the first embodiment will be described. The display device 1 in each modification is characteristic in the shapes of the openings 12, of openings 121 to 124, of the holes 10, of holes 101 to 103 or the dent 11, and of the first wires 9 in the bending portion B, and the others are the same as the display device 1 according to the first embodiment.

Modification 1-1

Figure 9:
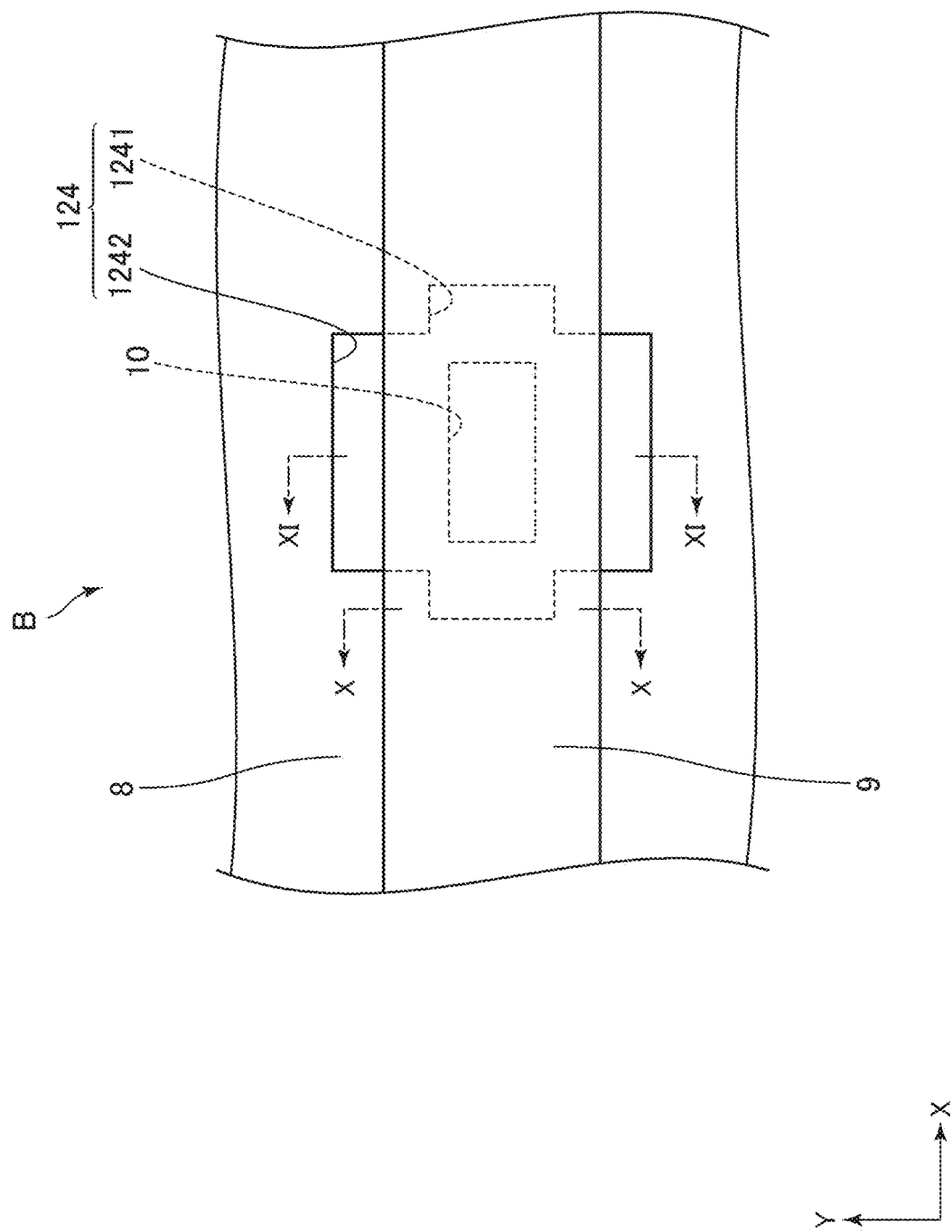
FIG. 9 is a plan view of modification 1-1.
Figure 10:
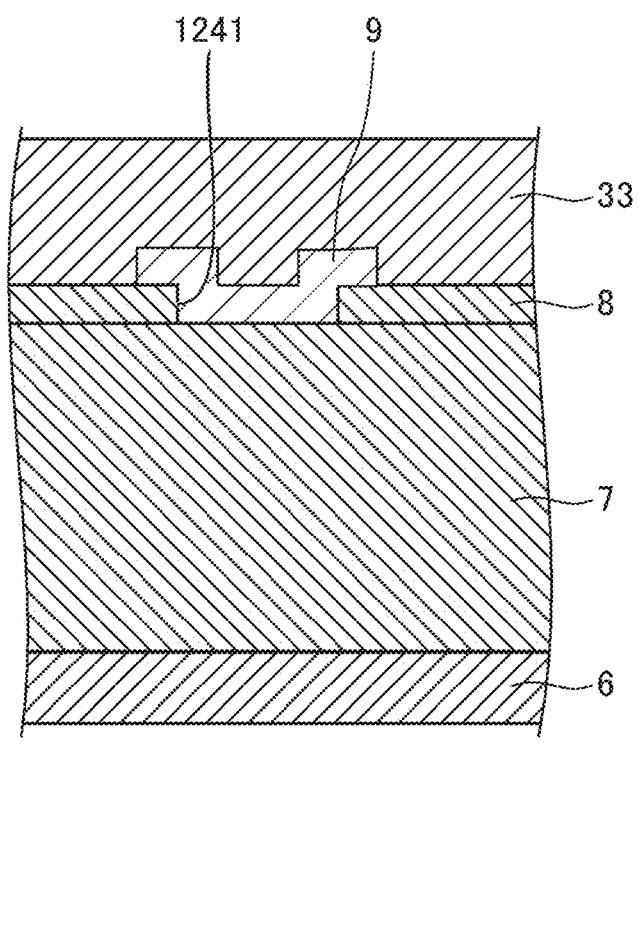
FIG. 10 is a sectional view taken along line X-X in FIG. 9.
Figure 11:
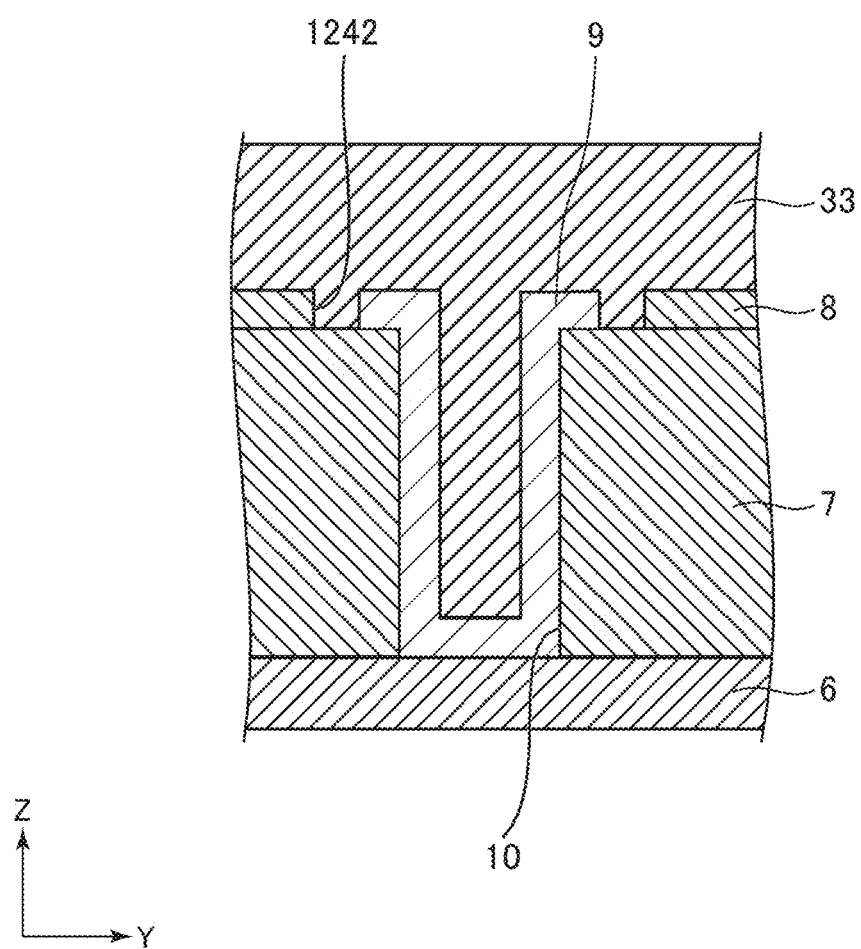
FIG. 11 is a sectional view taken along line XI-XI in FIG. 9.

FIG. 9 is a plan view of modification 1-1 of the display device 1. The illustration of the protective layer 33 is omitted in FIG. 9 for simplification: FIG. 9 is a plan view of a portion under the first wire 9. The display device in modification 1-1 has an opening 124 of the insulating layer 8 illustrated in FIG. 9. FIG. 10 is a sectional view taken along line X-X in FIG. 9. FIG. 11 is a sectional view taken along line XI-XI in FIG. 9. As illustrated in FIG. 9, the opening 124 in modification 1-1 includes a portion 1241, which is narrower in a plan view than the width of the first wire 9 in the Y-direction, and a portion 1242, which is wider in a plan view than the width of the first wire 9 in the Y-direction. Accordingly, the area of contact between the first wire 9 and the insulating layer 8 increases in the location of the opening 124, thus improving the adhesion between the first wire 9 and the insulating layer 8.

Modification 1-2

Figure 12:
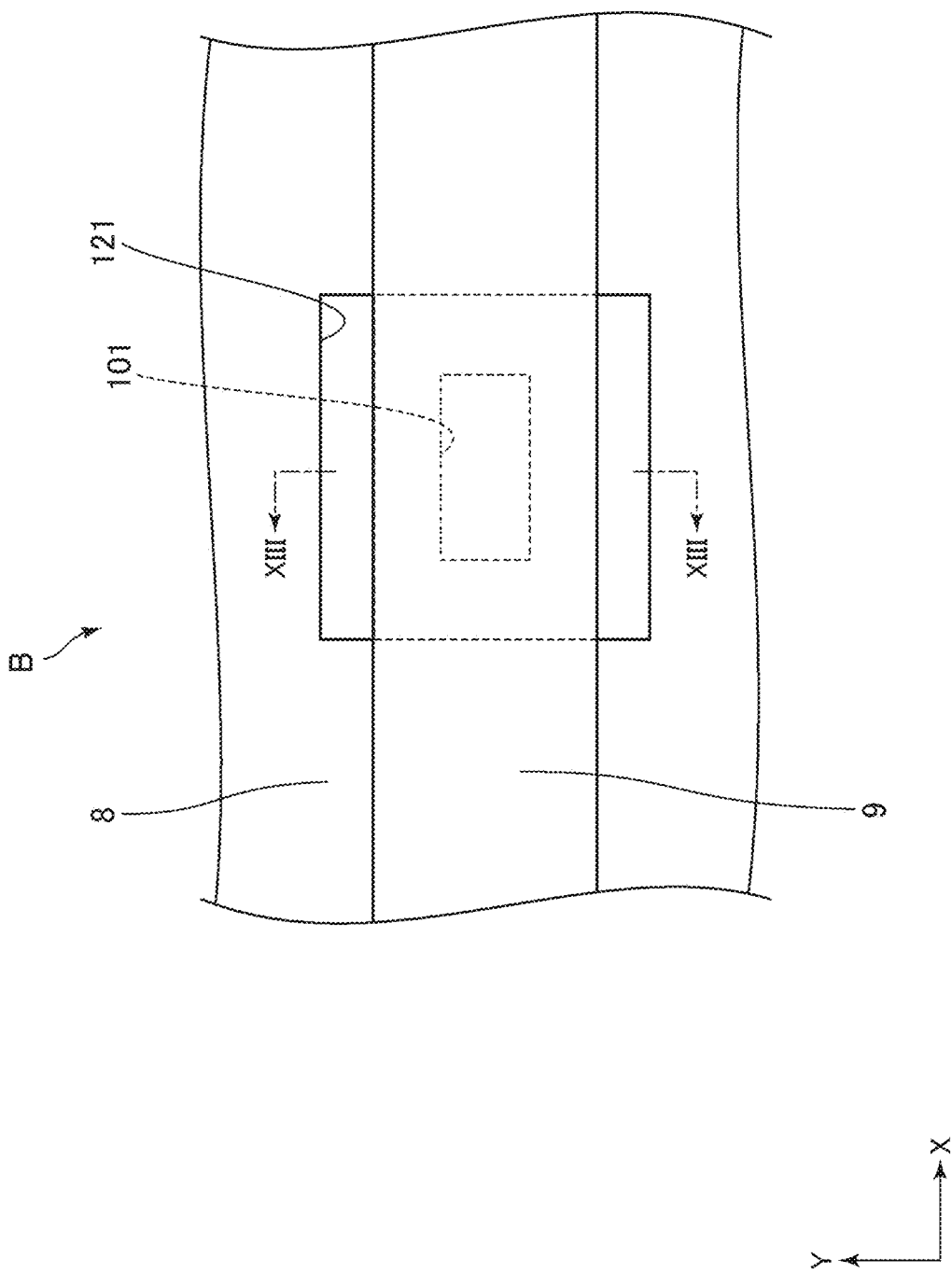
FIG. 12 is a plan view of modification 1-2.
Figure 13:
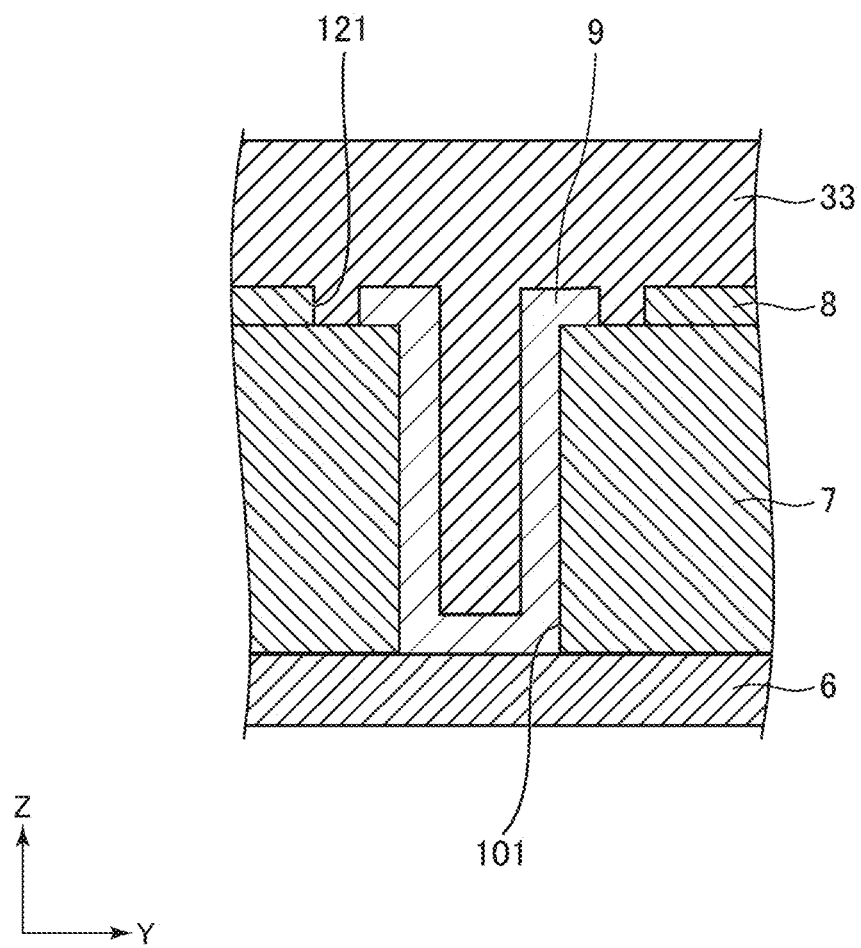
FIG. 13 is a sectional view taken along line XIII-XIII in FIG. 12.

The display device 1 in modification 1-2 has an opening 121 of the insulating layer 8 and an opening 101 of the resin layer 7 both illustrated in FIG. 12. The illustration of the protective layer 33 is omitted in FIG. 12 for simplification: FIG. 12 is a plan view of a portion under the first wire 9. FIG. 13 is a sectional view taken along line XIII-XIII in FIG. 12. As seen from FIG. 12 and FIG. 13, the width of the opening 121 in modification 1-2 is equal to or larger in the Y-direction than the width of a portion of the first wire 9 overlapping the opening 121 in a plan view. This configuration can avoid a crack that occurs in the insulating layer 8 and extends in the Y-direction, in the opening 121 before such a crack reaches the first wire 9. As a result, a break in the first wire 9 can be further prevented.

Further, as seen from FIG. 12 and FIG. 13, the width of the hole 101 in modification 1-2 is smaller in the Y-direction than the width of a portion of the opening 121 overlapping the hole 101 in a plan view. In this configuration, in FIG. 12, part of the first wire 9 crossing the opening 121 is in contact with the upper surface of the resin layer 7, as seen from FIG. 13. That is, part of the first wire 9 is in contact with the base at the bottom of the hole 101, and the upper end of the first wire 9 is located on the upper surface of the resin layer 7 inside the opening 121 of the insulating layer 8. This can prevent the first wire 9 from a break resulting from a level difference at the end of the insulating layer 8.

Modification 1-3

Figure 14:
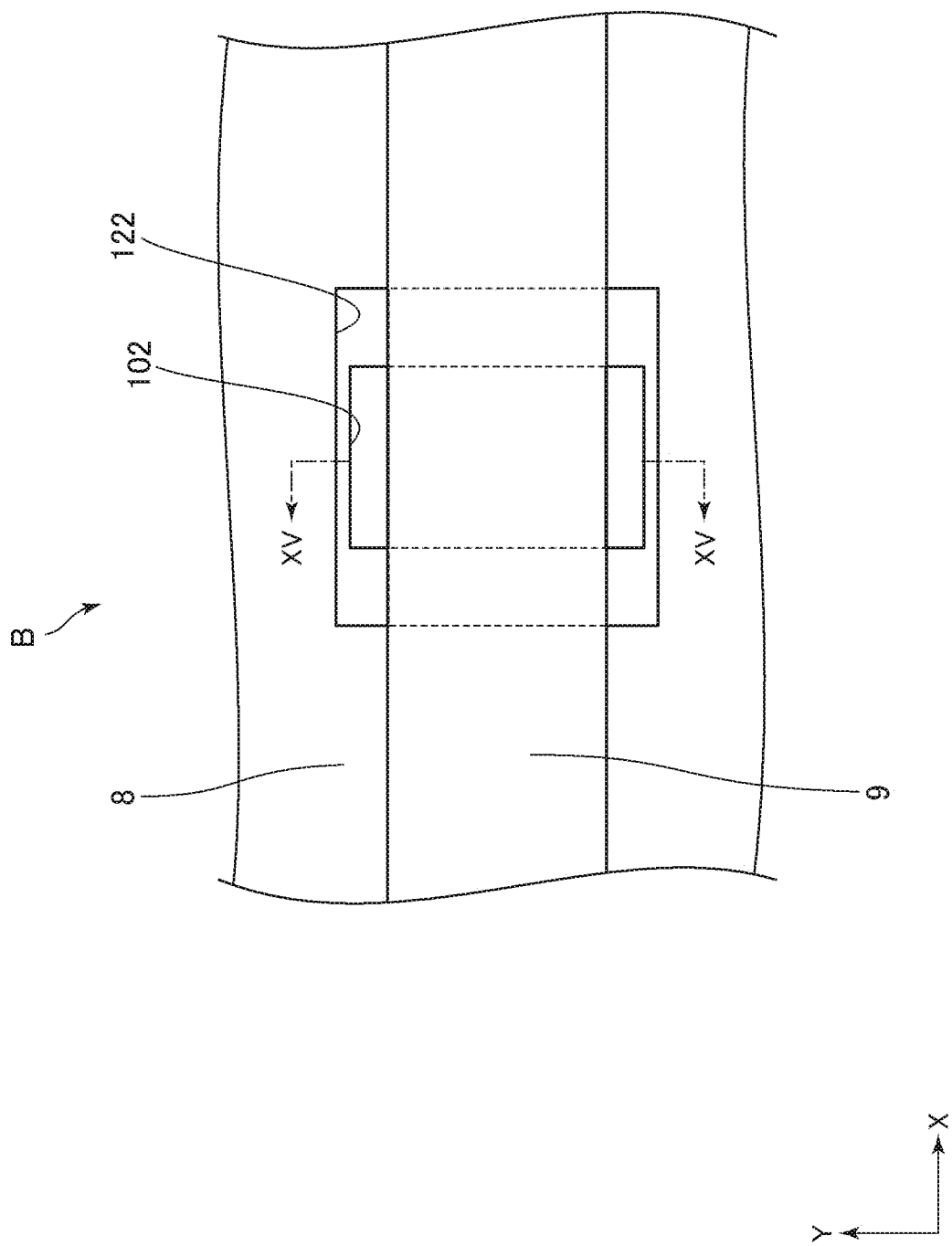
FIG. 14 is a plan view of modification 1-3.
Figure 15:
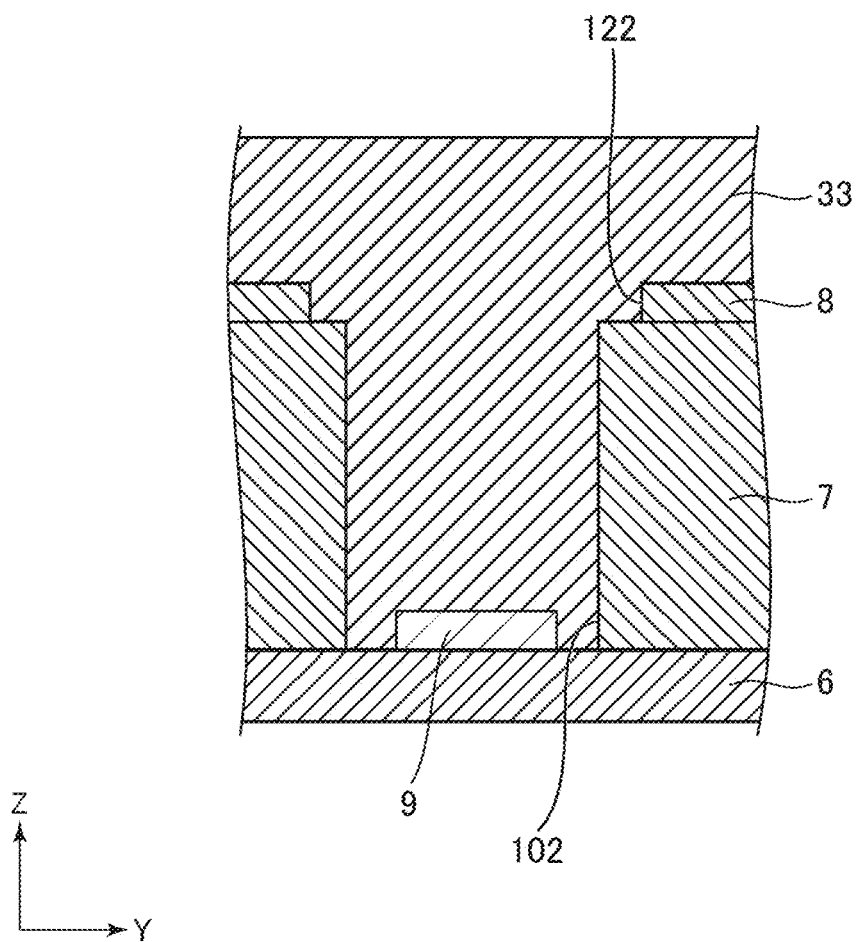
FIG. 15 is a sectional view taken along line XV-XV in FIG. 14.

Modification 1-3 provides an opening 122 and a hole 102 in FIG. 14. The illustration of the protective layer 33 is omitted in FIG. 14 for simplification: FIG. 14 is a plan view of a portion under the first wire 9. FIG. 15 is a sectional view taken along line XV-XV in FIG. 14. In modification 1-3, the width of the hole 102 is equal to or larger in the Y-direction than the width of the first wire 9. The first wire 9 is included in the hole 102 in the Y-direction. Thus, as seen from FIG. 15, the first wire 9 is provided on only the bottom surface of the hole 102 in a sectional view. Thus, the first wire 9 extends in the X-direction without crossing a level difference located at the upper and lower ends of the resin layer 7 and insulating layer 8 in the Y-direction. Consequently, a break in the first wire 9 can be further prevented.

Modification 1-4

Figure 16:
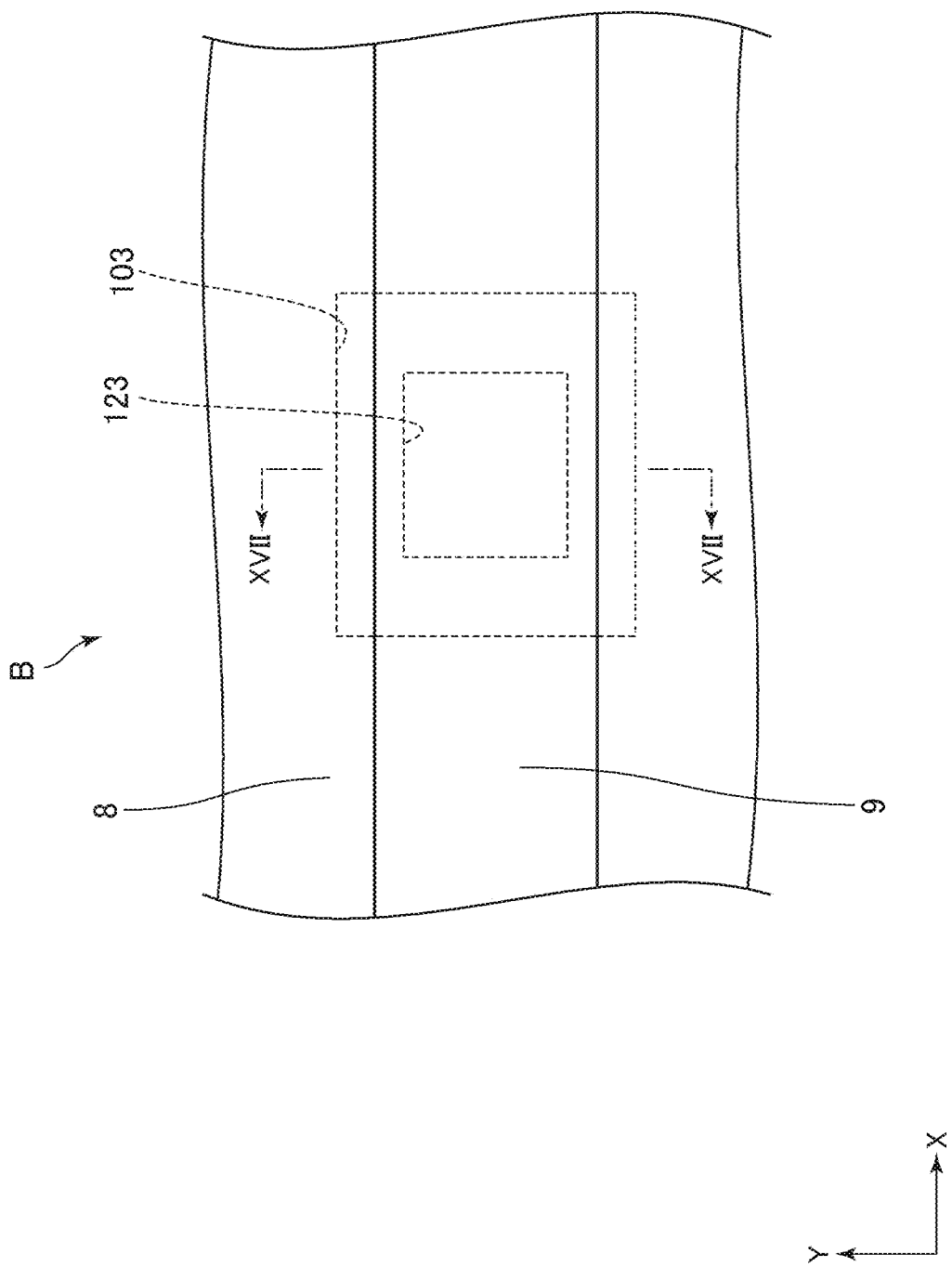
FIG. 16 is a plan view of modification 1-4.
Figure 17:
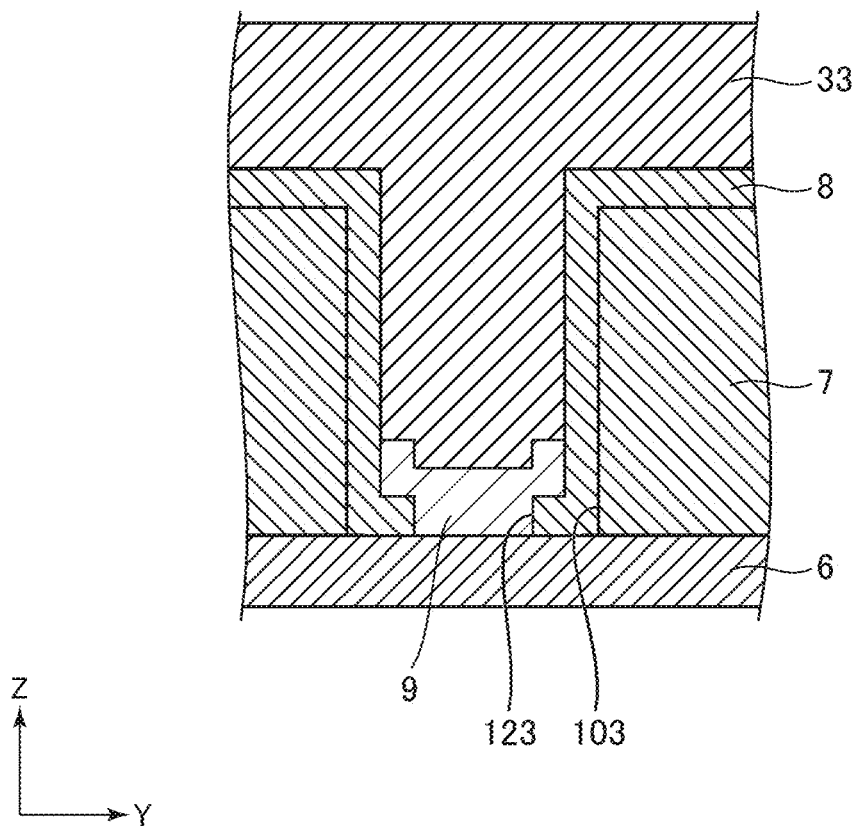
FIG. 17 is a sectional view taken along line XVII-XVII in FIG. 15.

Modification 1-4 provides an opening 123 and a hole 103 in FIG. 16. The illustration of the protective layer 33 is omitted in FIG. 16 for simplification: FIG. 16 is a plan view of a portion under the first wire 9. FIG. 17 is a sectional view taken along line XVII-XVII in FIG. 16. In the display device 1 in modification 1-4, the width of the opening 123 is smaller in the Y-direction than the width of a portion of the hole 103 overlapping the opening 123 in a plan view. In this configuration, the resin layer 7 is not exposed because the side surface of the hole 103 of the resin layer 7 is covered with the insulating layer 8 during etching in a patterning step for forming the first wires 9. This can prevent particle adhesion to other portions that is caused by the removal and scattering of the resin layer 7 during etching, thereby preventing contamination resulting from the scattering of the resin layer 7.

Modification 1-5

Figure 18:
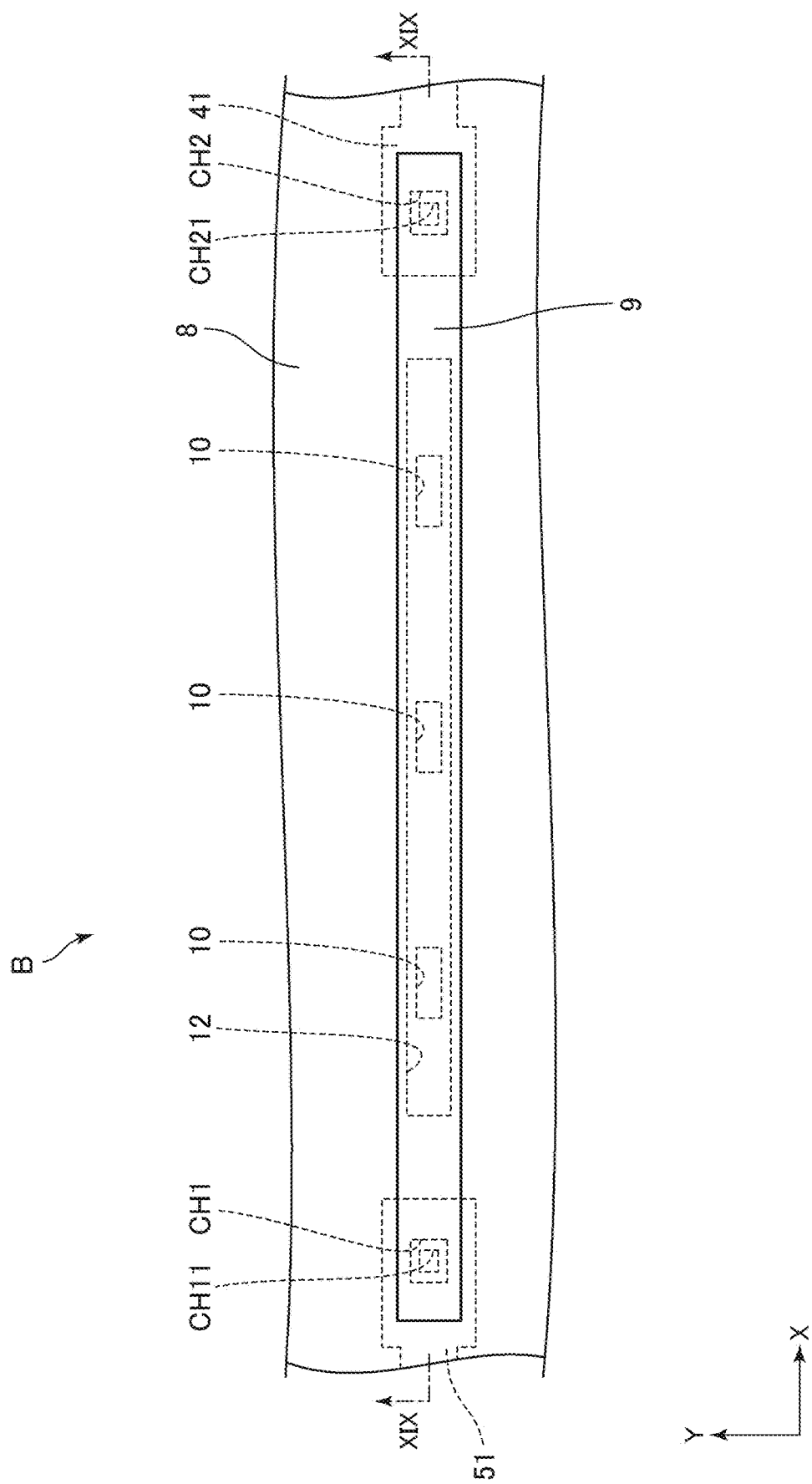
FIG. 18 is a plan view of modification 1-5.
Figure 19:
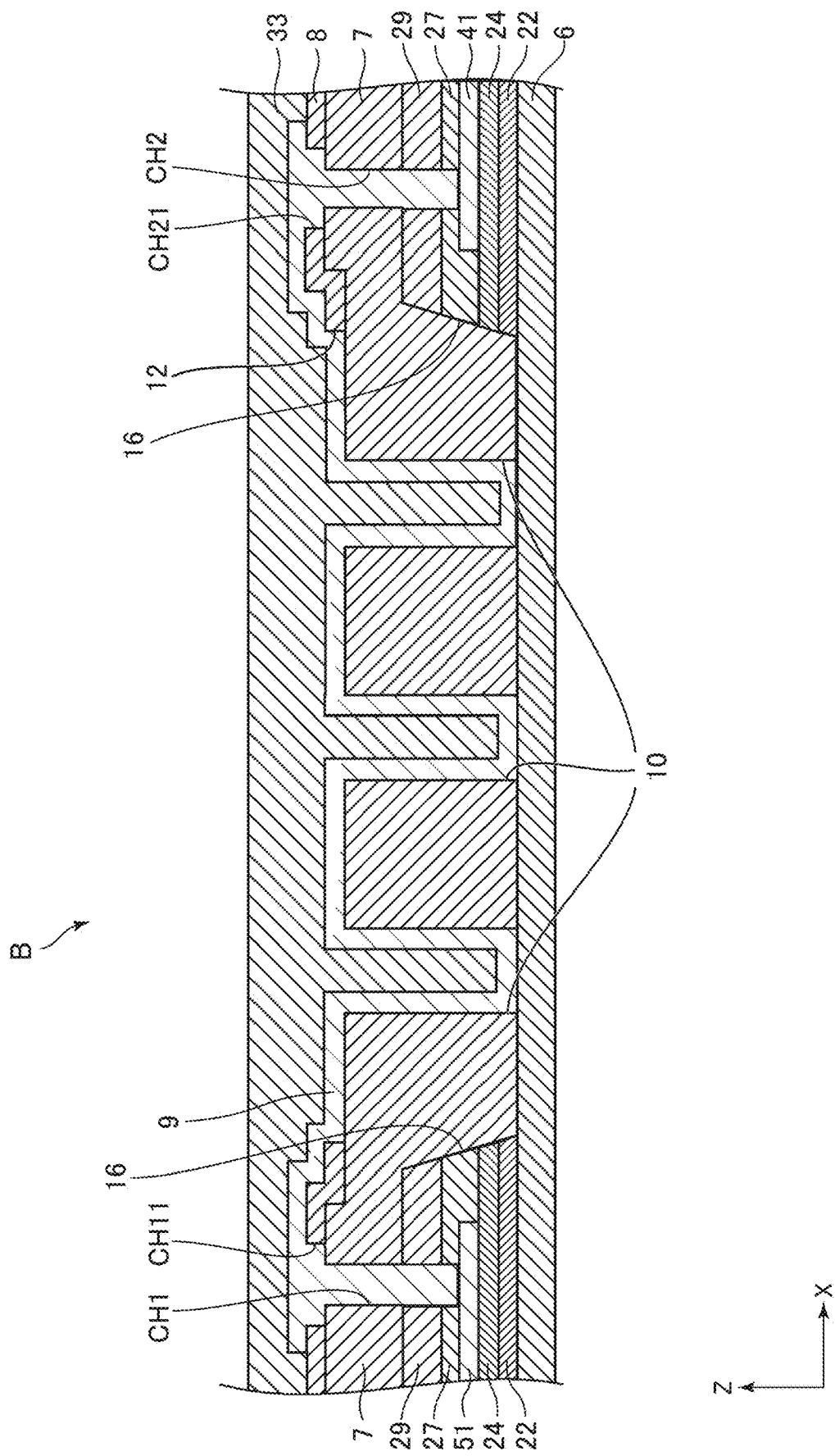
FIG. 19 is a sectional view taken along line XIX-XIX in FIG. 18.

FIG. 18 is a plan view of modification 1-5 of the display device 1. FIG. 19 is a sectional view taken along line XIX-XIX in FIG. 18. The illustration of the protective layer 33 is omitted in FIG. 18 for simplification: FIG. 18 is a plan view of a portion under the first wire 9. In the display device 1 in modification 1-5, the opening 12 overlaps the first wire 9 in a plan view in any location under the first wire 9 within the bending portion B when a crack of the insulating layer 8 extends in the Y-direction in the bending portion B. To be more specific, the opening 12 is provided to cross the bending portion B in the X-direction, as seen from FIG. 18 and FIG. 19. Thus, the opening 12, which is located entirely under the first wire 9, can stop crack extension even if a crack that extends in the Y-direction in the insulating layer 8 occurs in any location within the bending portion B. As a result, a break in the first wire 9 can be further prevented.

Modification 1-6

Figure 20:
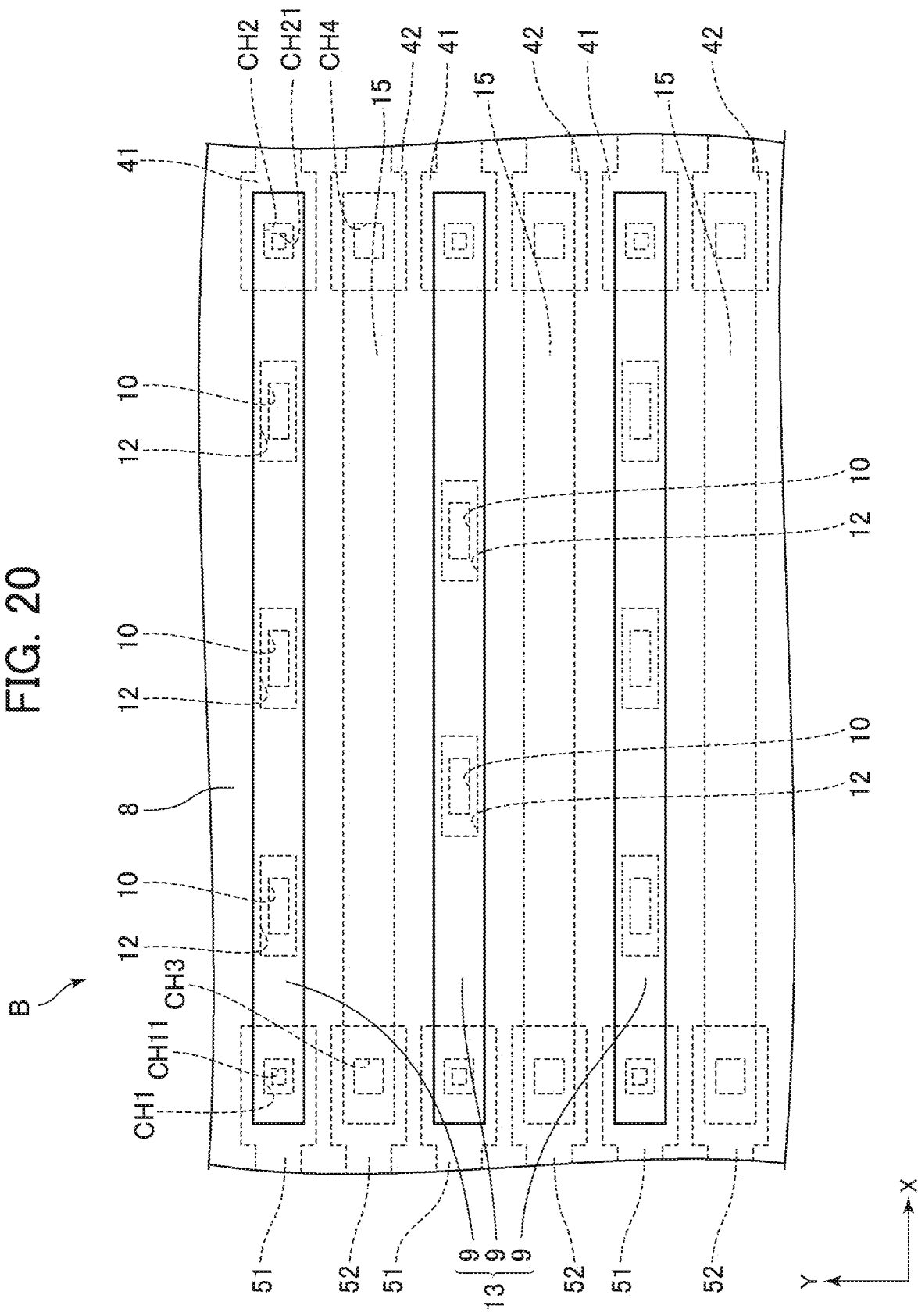
FIG. 20 is a plan view of modification 1-6.

FIG. 20 is a plan view of modification 1-6. The illustration of the protective layer 33 is omitted in FIG. 20 for simplification: FIG. 20 is a plan view of a portion under the first wire 9. The display device 1 in modification 1-6 has, in the bending portion B, a first-wire group 13 with a plurality of first wires 9 spaced from each other in the Y-direction. In the Y-direction, at least one opening 12 overlaps the first-wire group 13 in a plan view. For instance, as seen from FIG. 20, in a plan view of the first-wire group 13, at least any one of the plurality of openings 12 is located on an imaginary line in the Y-direction. In this configuration, the opening 12 is located somewhere in the first-wire group 13 when the bending portion B is viewed in the Y-direction. Accordingly, at least any one of the plurality of openings 12 stops crack extension even if a crack that extends in the Y-direction in the bending portion B occurs in any location in the insulating layer 8. This can prevent the first-wire group 13 from a break resulting from a few cracks.

It is noted that although modifications 1-1 through 1-6 have described an instance where the holes 10 are provided in the resin layer 7, an instance where dents 11 instead of the holes 10 are provided in the resin layer 7 is also similar. In the present disclosure, the width of the dents 11 is the width in the Y-direction of the bottoms of the dents 11 in the Z-direction.

Second Embodiment

Figure 21:
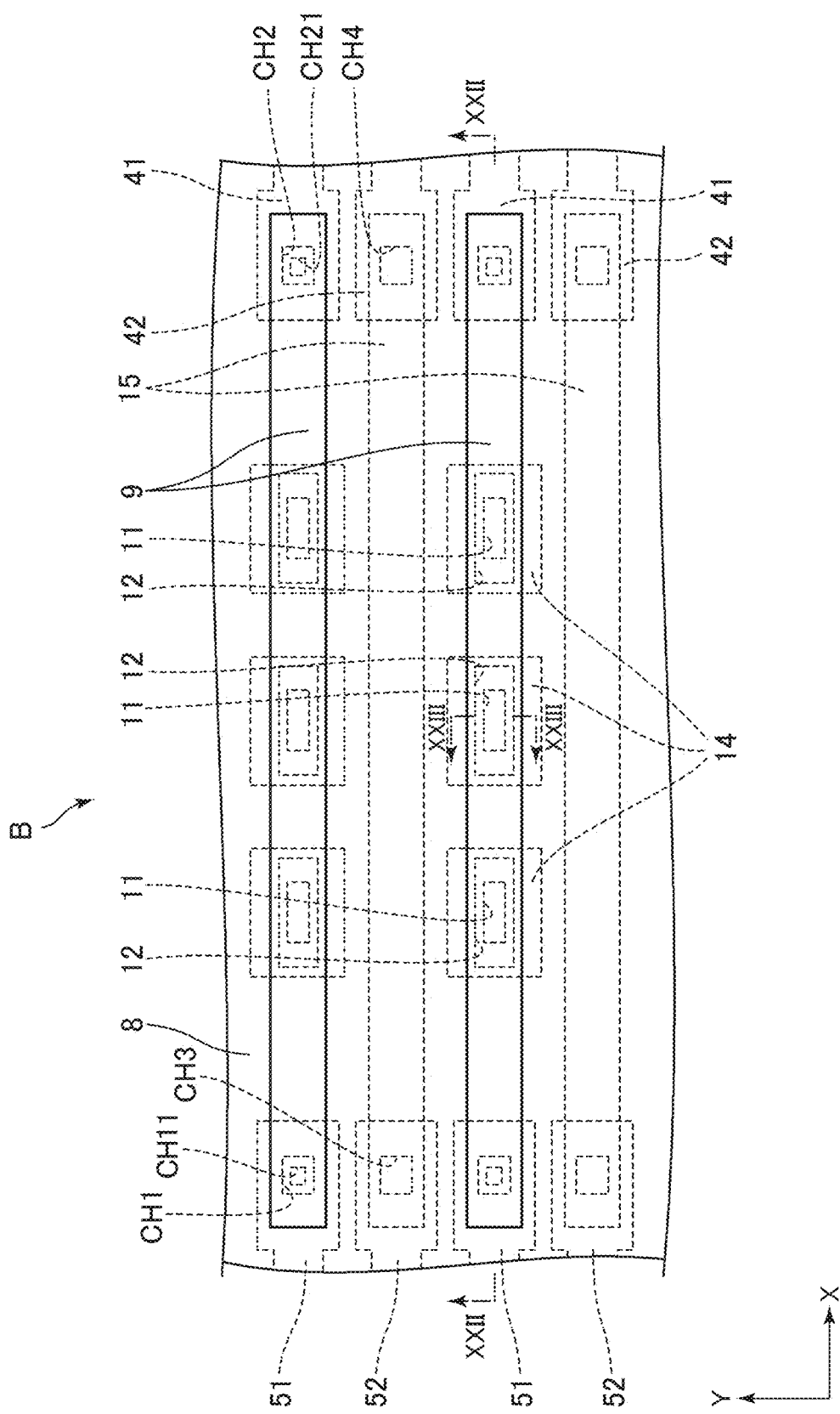
FIG. 21 is a plan view of the bending portion according to a second embodiment.
Figure 22:
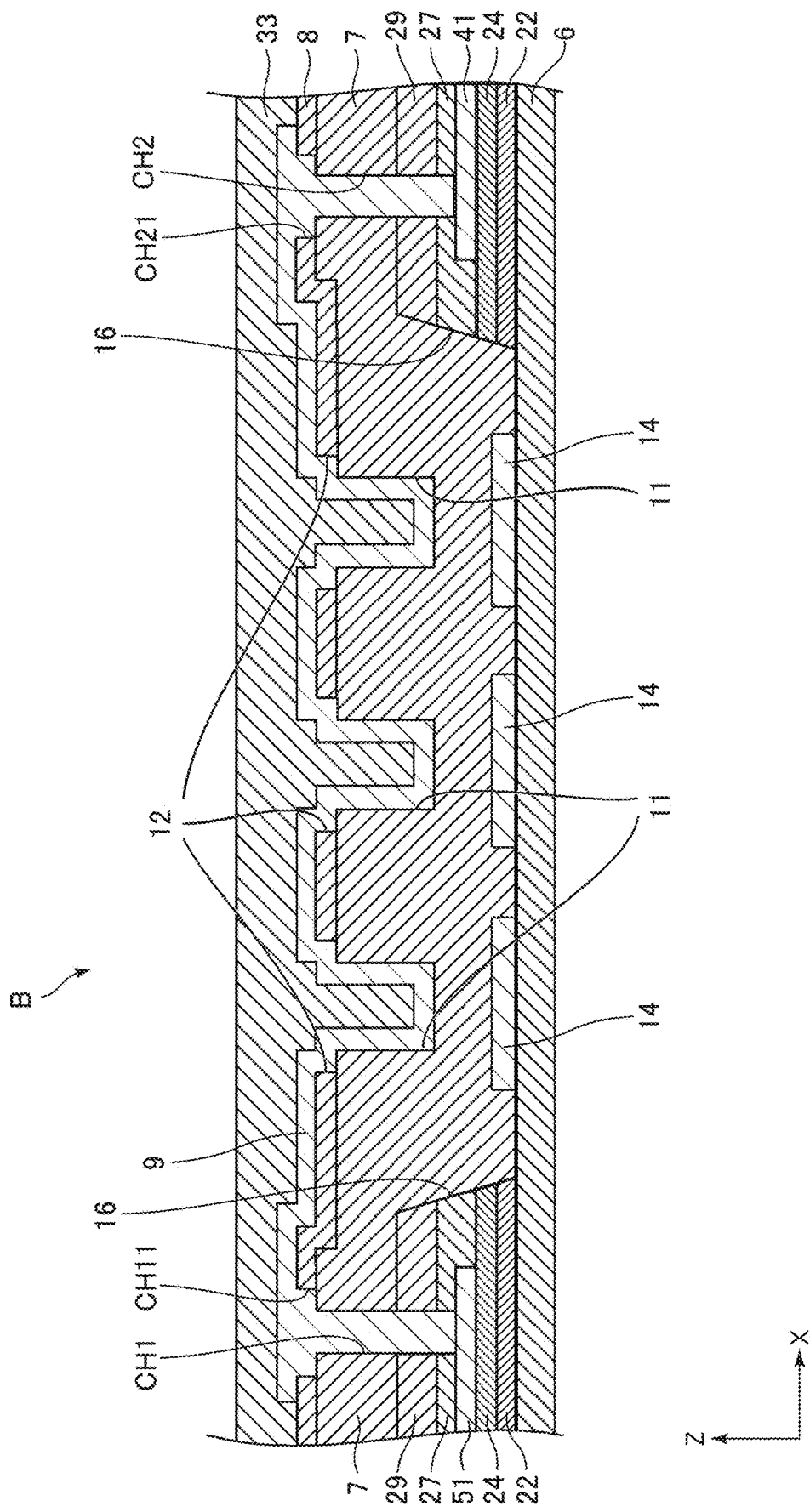
FIG. 22 is a sectional view taken along line XXII-XXII in FIG. 21.
Figure 23:
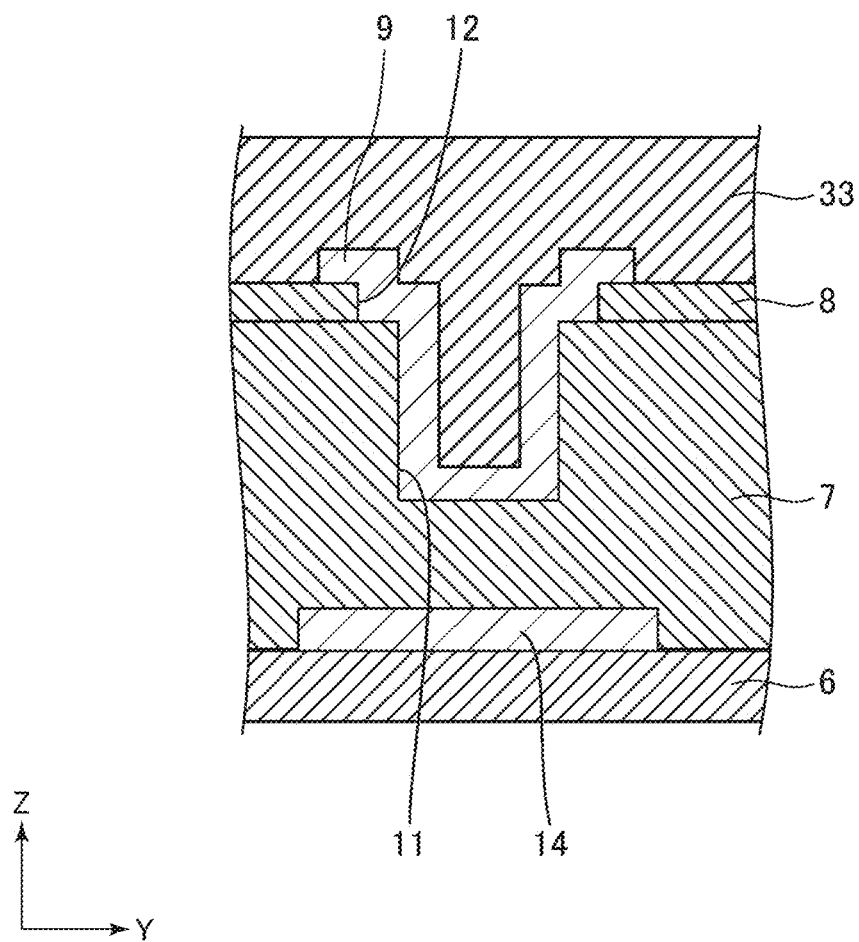
FIG. 23 is a sectional view taken along line XXIII-XXIII in FIG. 21.

FIG. 21 is a plan view of the bending portion B according to a second embodiment of the present disclosure. The illustration of the protective layer 33 is omitted in FIG. 21 for simplification: FIG. 21 is a plan view of a portion under the first wire 9. It is noted that the second embodiment and the first embodiment are different in the structure of the bending portion B, and that the description of the others that are common will be omitted as appropriate. FIG. 22 is a sectional view taken along line XXII-XXII in FIG. 21. FIG. 23 is a sectional view taken along line XXIII-XXIII in FIG. 21.

As seen from FIG. 22 and FIG. 23, the display device 1 according to the second embodiment has level difference mitigating portions 14 provided under the openings 12 and between the upper surface of the base 6 and the lower surface of the resin layer 7. The first wire 9 is buried in the openings 12 and the dents 11, overlapping the openings 12, and is not in contact with the level difference mitigating portions 14. In this case, the first wire 9 is thin in portions buried in the openings 12 and dents 11. The first wire 9 is hence possibly cut in these thin portions. In the second embodiment, providing the level difference mitigating portions 14 reduces the height of the level differences in the dents 11, with which the first wire 9 is in contact, thus preventing a cut in the first wire 9.

Modification 2-1

Figure 24:
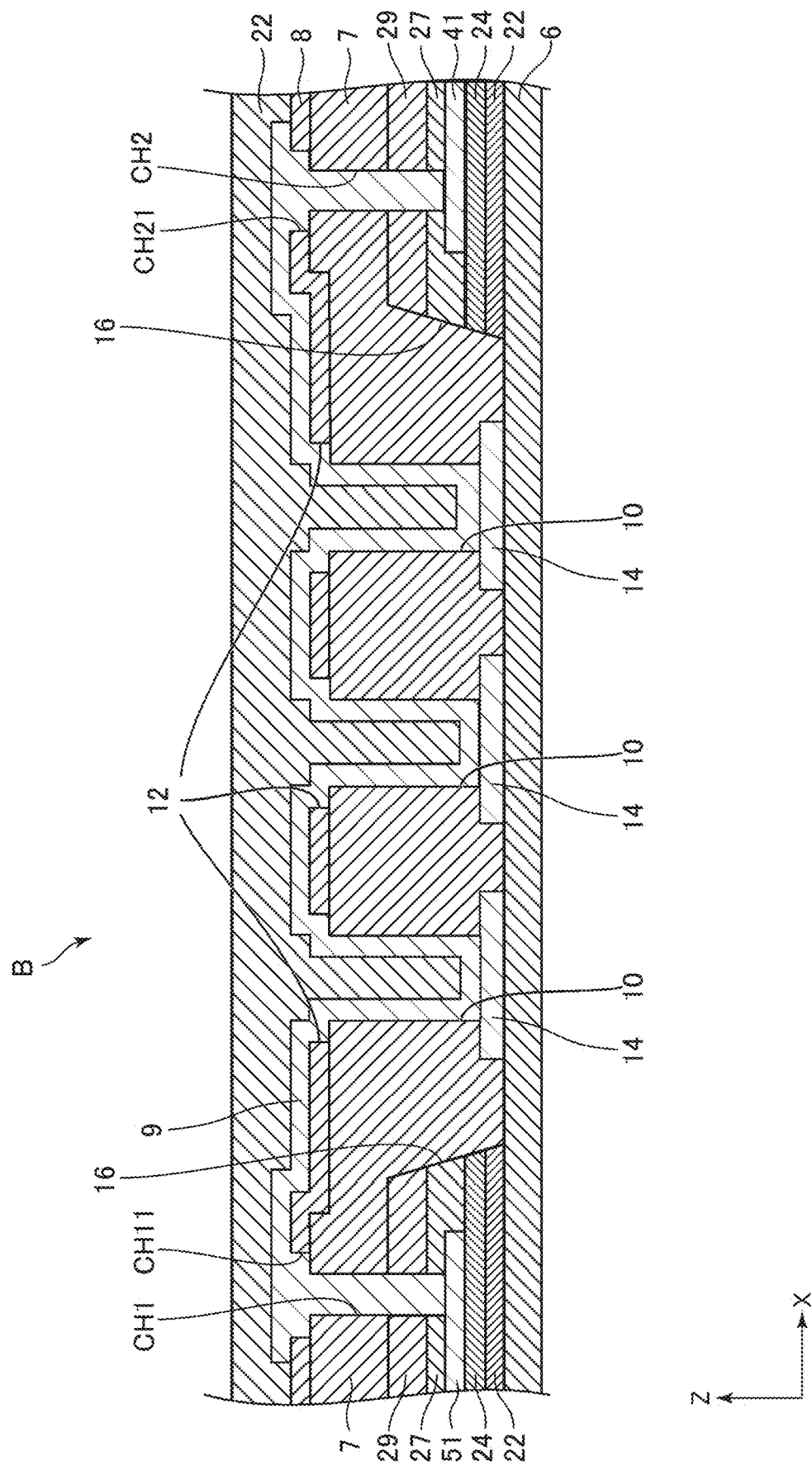
FIG. 24 is a sectional view of modification 2-1 corresponding to FIG. 22.
Figure 25:
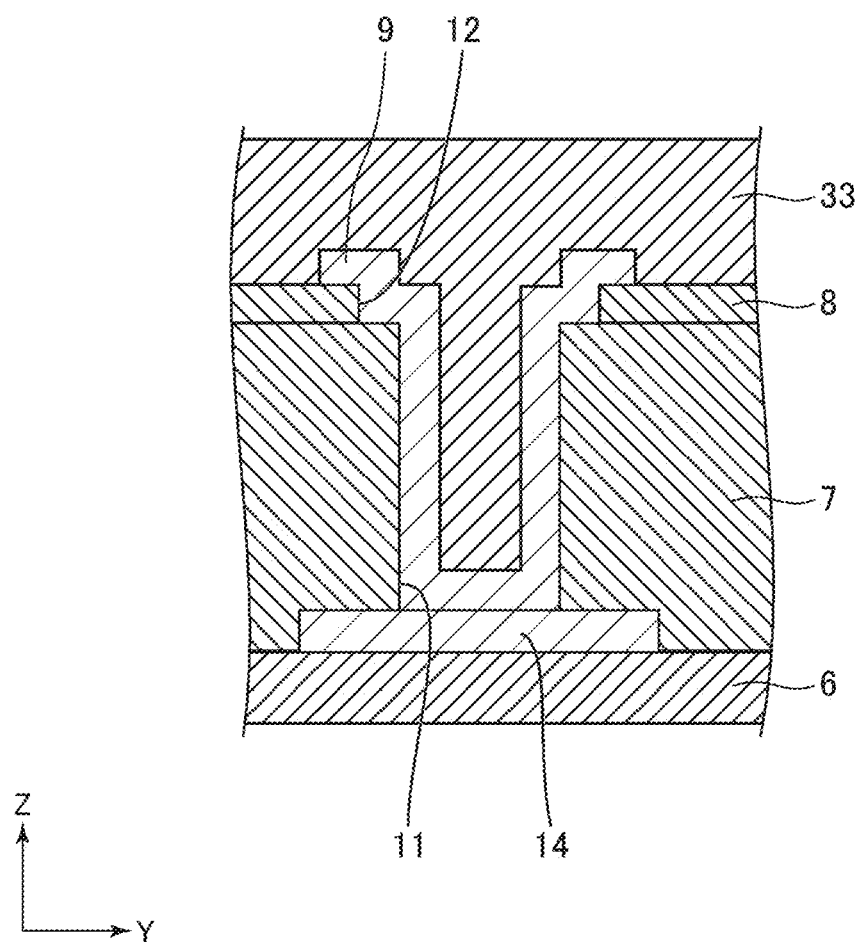
FIG. 25 is a sectional view of modification 2-1 corresponding to FIG. 23.

FIG. 24 and FIG. 25 are sectional views of the display device 1 in modification 2-1 of the second embodiment. FIG. 24 corresponds to FIG. 22 in the second embodiment, and FIG. 25 corresponds to FIG. 23 in the second embodiment. In modification 2-1, the openings 12, the holes 10, and the level difference mitigating portions 14 overlap each other in a plan view. The first wire 9 is buried in the openings 12 and the holes 10 to be thus in contact with the level difference mitigating portions 14. The level difference mitigating portions 14 are formed of a conductive material. This configuration keeps both two cut parts of the first wire 9 in contact with the level difference mitigating portions 14 even if the first wire 9 becomes thin at the bottoms of the holes 10 to be thus cut. Accordingly, the level difference mitigating portions 14, which are conductive, maintain an electrical connection between the two cut parts of the first wire 9. Consequently, a break in the first wire 9 can be further prevented.

The level difference mitigating portions 14 are placed under the resin layer 7, as illustrated in FIG. 24 and FIG. 25. Thus, in a process step of forming the pixels 21, the level difference mitigating portions 14 need to be formed before the resin layer 7 is formed.

Figure 26:
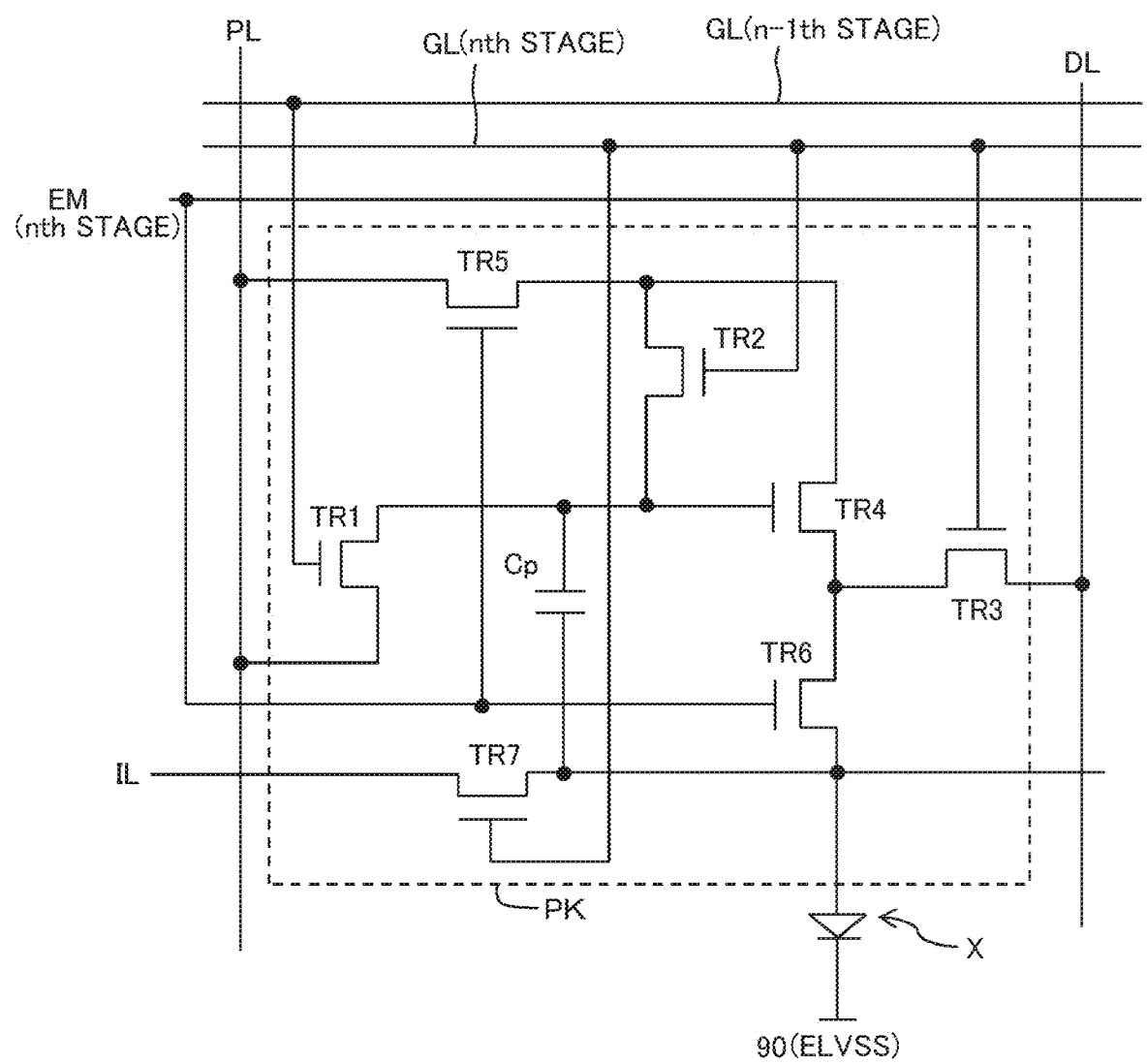
FIG. 26 is a circuit diagram of an example drive circuit of the present disclosure.

FIG. 26 is a circuit diagram of an example drive circuit PK of the present disclosure. Although not shown, the display region 2 in FIG. 1 includes a light-emitting element X and a drive circuit PK both in FIG. 26, which are provided for each pixel 21. The TFT layer 300 (not shown) including the TFTs 3 illustrated in FIG. 1 includes wires individually connected to the drive circuits PK and the drive circuits PK.

The drive circuit PK in FIG. 26 includes the following: a capacitive element Cp: a first initialization transistor TR1 having a gate terminal connected to a scan signal line GL of an anterior stage (n−1th stage); and a threshold control transistor TR2 having a gate terminal connected to a scan signal line GL of a target stage (nth stage). The drive circuit PK includes the following: a write transistor TR3 having a gate terminal connected to the scan signal line GL of the target stage (nth stage); a drive transistor TR4 that controls a current flowing through the light-emitting element X: and a power supply transistor TR5 having a gate terminal connected to a light-emission control line EM. The drive circuit PK includes the following: a light-emission control transistor TR6 having a gate terminal connected to the light-emission control line EM; and a second initialization transistor TR7 having a gate terminal connected to the scan signal line GL of the target stage (nth stage).

The drive transistor TR4 has a gate terminal connected to the anode of the light-emitting element X via the capacitive element Cp and connected to a high-voltage power-source line PL via the first initialization transistor TR1. The drive transistor TR4 has a source terminal connected to a data signal line DL via the write transistor TR3 and connected to the anode of the light-emitting element X via the light-emission control transistor TR6. The drive transistor TR4 has a drain terminal connected to the gate terminal of the drive transistor TR4 via the threshold control transistor TR2 and connected to the high-voltage power source line PL via the power supply transistor TR5. The anode of the light-emitting element X is connected to an initialization power-source line IL via the second initialization transistor TR7. The initialization power-source line IL and a cathode 90 of the light-emitting element X are supplied with a low-voltage power source.

To easily bend the bending portion B, the base coat film 22, the first interlayer insulating film 27, the second interlayer insulating film 29, and the gate insulating film 24 are all removed in the bending portion B. That is, to remove these films, etching is performed for removing films containing a semiconductor material as their composition. Accordingly, the level difference mitigating portions 14 are each preferably formed of the same conductive material as any one of the scan signal line GL, the light-emission control line EM, the initialization power-source line IL, the data signal line DL, the gate electrode 25, the gate wire 26, the source electrode 30, and the drain electrode 31. Accordingly, a conductor material is less etched during an etching process corresponding to a semiconductor material, and hence, the level difference mitigating portions 14 can be formed without an additional photolithography process step. Thus, the level difference mitigating portions 14 can be formed without additional process steps along with the components of the display region 2.

The second wires 15 can be formed of the same material and in the same layer as the level difference mitigating portions 14. That is, the level difference mitigating portions 14 can be formed at the same time as the second wires 15 without additional process steps.

The invention claimed is:

1. A display device having a display region including a thin-film transistor, a terminal section, and a bending portion provided between the display region and the terminal section, the display device comprising:
a resin layer provided above a base in the bending portion;
an insulating layer provided to cover the resin layer; and
a first wire provided above the insulating layer and extending in a first direction to electrically connect the thin-film transistor and the terminal section together, the first direction being a direction where the display region and the terminal section are disposed,
wherein in the bending portion,
the resin layer has at least one hole or dent overlapping the first wire in a plan view, and
the insulating layer has at least one opening overlapping the at least one hole or dent in a plan view, and
in a direction intersecting with the first direction, a width of the at least one opening is smaller than a width of a portion of the at least one hole or dent overlapping the at least one opening in a plan view.

2. The display device according to claim 1, wherein in a direction intersecting with the first direction, a width of the at least one opening is equal to or larger than a width of a portion of the first wire overlapping the at least one opening in a plan view.

3. The display device according to claim 1, wherein in a direction intersecting with the first direction, a width of the at least one opening is smaller than a width of a portion of the first wire overlapping the at least one opening in a plan view.

4. The display device according to claim 3, wherein in a direction intersecting with the first direction, a width of the at least one hole or dent is smaller than a width of a portion of the at least one opening overlapping the at least one hole or dent in a plan view.

5. The display device according to claim 3, wherein in a direction intersecting with the first direction, a width of the at least one hole or dent is equal to or larger than a width of a portion of the first wire overlapping the at least one hole or dent in a plan view.

6. The display device according to claim 3, wherein in a direction intersecting with the first direction, the at least one opening includes a narrower portion and a wider portion than the width of the first wire.

7. The display device according to claim 1, wherein in the bending portion, the at least one opening overlaps the first wire in a plan view in all locations under the first wire.

8. The display device according to claim 1, comprising a first-wire group with a plurality of the first wires spaced from each other in a direction intersecting with the first direction,
wherein the at least one opening overlaps the first-wire group in the direction intersecting with the first direction.

9. The display device according to claim 1, comprising at least one level difference mitigating portion provided under the at least one opening, and between an upper surface of the base and a lower surface of the resin layer.

10. The display device according to claim 1, comprising a second wire electrically connecting the thin-film transistor and the terminal section together, and extending along the first wire.

11. The display device according to claim 10, wherein the second wire is provided under the resin layer.

12. A display device having a display region including a thin-film transistor, a terminal section, and a bending portion provided between the display region and the terminal section, the display device comprising:
a resin layer provided above a base in the bending portion;
an insulating layer provided to cover the resin layer; and
a first wire provided above the insulating layer and extending in a first direction to electrically connect the thin-film transistor and the terminal section together, the first direction being a direction where the display region and the terminal section are disposed,
wherein in the bending portion,
the resin layer has at least one hole or dent overlapping the first wire in a plan view, the insulating layer has at least one opening overlapping the at least one hole or dent in a plan view, and in a direction intersecting with the first direction, a width of the at least one opening is smaller than a width of a portion of the first wire overlapping the at least one opening in a plan view.

13. The display device according to claim 12, wherein in a direction intersecting with the first direction, a width of the at least one opening is smaller than a width of a portion of the at least one hole or dent overlapping the at least one opening in a plan view.

14. The display device according to claim 12, wherein in a direction intersecting with the first direction, a width of the at least one hole or dent is smaller than a width of a portion of the at least one opening overlapping the at least one hole or dent in a plan view.

15. The display device according to claim 12, wherein in a direction intersecting with the first direction, a width of the at least one hole or dent is equal to or larger than a width of a portion of the first wire overlapping the at least one hole or dent in a plan view.

16. The display device according to claim 12, wherein in a direction intersecting with the first direction, the at least one opening includes a narrower portion and a wider portion than the width of the first wire.

17. The display device according to claim 12, wherein in the bending portion, the at least one opening overlaps the first wire in a plan view in all locations under the first wire.

18. The display device according to claim 12, comprising a first-wire group with a plurality of the first wires spaced from each other in a direction intersecting with the first direction, wherein the at least one opening overlaps the first-wire group in the direction intersecting with the first direction.

19. The display device according to claim 12, comprising at least one level difference mitigating portion provided under the at least one opening, and between an upper surface of the base and a lower surface of the resin layer.

20. The display device according to claim 12, comprising a second wire electrically connecting the thin-film transistor and the terminal section together, and extending along the first wire.

* * * * *